US011562791B1

(12) United States Patent
Nguyen et al.

(10) Patent No.: US 11,562,791 B1
(45) Date of Patent: Jan. 24, 2023

(54) MEMORY DEVICES WITH FOUR DATA LINE BIAS LEVELS

(71) Applicant: MICRON TECHNOLOGY, INC., Boise, ID (US)

(72) Inventors: Hao T. Nguyen, San Jose, CA (US); Tomoko Ogura Iwasaki, San Jose, CA (US); Erwin E. Yu, San Jose, CA (US); Dheeraj Srinivasan, San Jose, CA (US); Sheyang Ning, San Jose, CA (US); Lawrence Celso Miranda, San Jose, MN (US); Aaron S. Yip, Los Gatos, CA (US); Yoshihiko Kamata, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/396,825

(22) Filed: Aug. 9, 2021

(51) Int. Cl.
*G11C 16/04* (2006.01)
*G11C 16/10* (2006.01)
*G11C 16/34* (2006.01)
*G11C 16/26* (2006.01)
*G11C 11/56* (2006.01)

(52) U.S. Cl.
CPC .......... *G11C 16/0483* (2013.01); *G11C 16/10* (2013.01); *G11C 16/26* (2013.01); *G11C 16/3459* (2013.01); *G11C 11/5621* (2013.01); *G11C 11/5671* (2013.01)

(58) Field of Classification Search
CPC ..... G11C 16/0483; G11C 16/10; G11C 16/26; G11C 16/3459; G11C 11/5621; G11C 11/5671

USPC .................................................. 365/185.03
See application file for complete search history.

(56) References Cited

U.S. PATENT DOCUMENTS

| 7,009,878 | B2 * | 3/2006  | Hosono ............... | G11C 11/5635  |
|           |      |         |                      | 365/185.08    |
| 7,813,182 | B2 * | 10/2010 | Kamata ................ | G11C 7/062    |
|           |      |         |                      | 365/185.21    |
| 8,391,061 | B2 * | 3/2013  | Elmhurst ........... | G11C 16/3454  |
|           |      |         |                      | 365/185.21    |
| 9,030,870 | B2 * | 5/2015  | Moschiano ............ | G11C 16/26    |
|           |      |         |                      | 365/185.24    |
| 9,042,183 | B2 * | 5/2015  | Kamata ................. | G11C 16/08    |
|           |      |         |                      | 365/185.21    |

* cited by examiner

*Primary Examiner* — Tha-O H Bui
(74) *Attorney, Agent, or Firm* — Dicke, Billig & Czaja, PLLC

(57) ABSTRACT

Memory devices might include a first latch to store a first data bit; a second latch to store a second data bit; a data line selectively connected to the first latch, the second latch, and a string of series-connected memory cells; and a controller configured to bias the data line during a programing operation of a selected memory cell. The controller may with the first data bit equal to 0 and the second data bit equal to 0, bias the data line to a first voltage level; with the first data bit equal to 1 and the second data bit equal to 0, bias the data line to a second voltage level; with the first data bit equal to 0 and the second data bit equal to 1, bias the data line to a third voltage level; and with the first data bit equal to 1 and the second data bit equal to 1, bias the data line to a fourth voltage level.

24 Claims, 17 Drawing Sheets

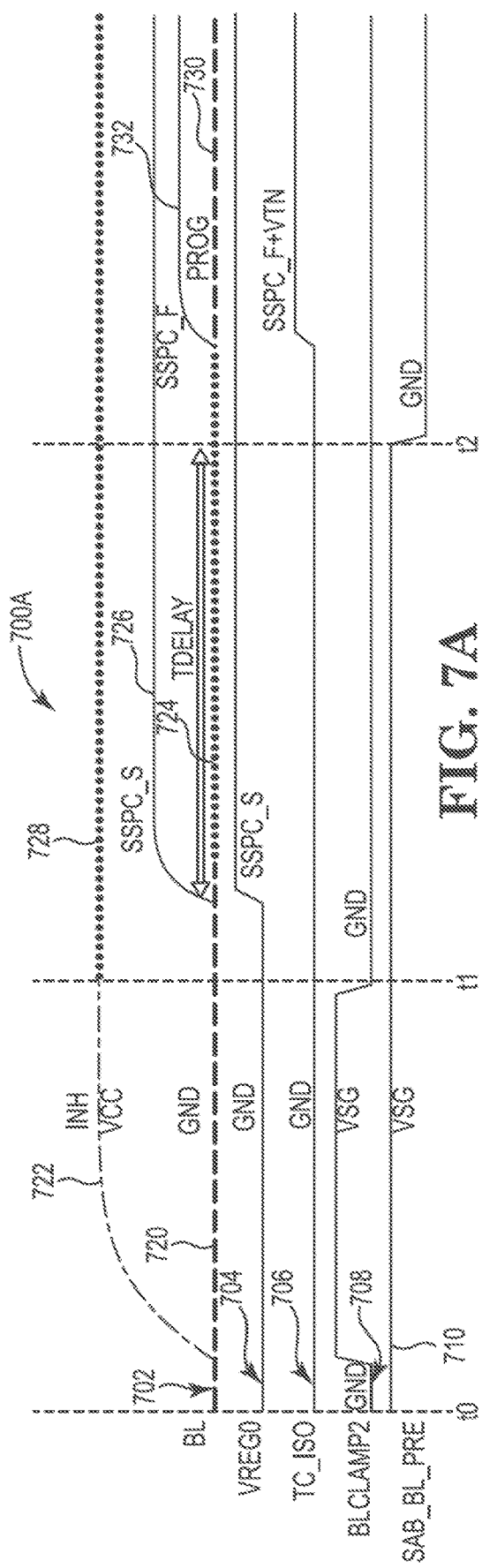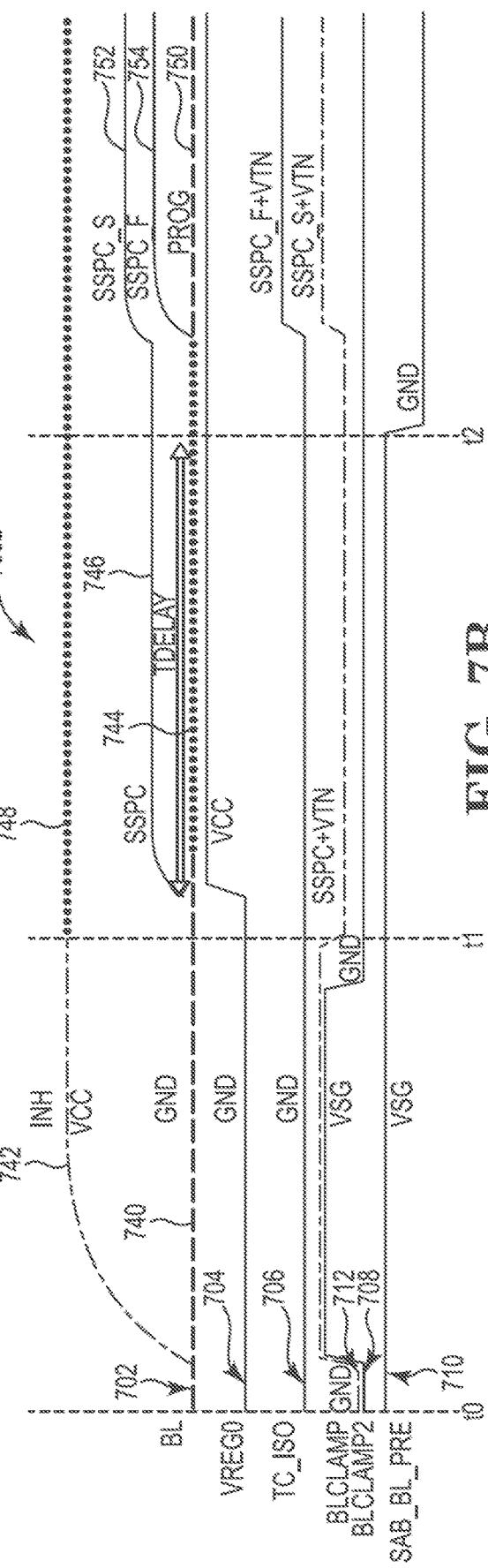
FIG. 7A
FIG. 7B

WITH THE DATA LINE BIASED TO THE FIRST VOLTAGE LEVEL, TURN OFF THE FIRST SWITCH AND FLOAT THE DATA LINE — 910

WITH THE DATA LINE FLOATED, CONNECT THE DATA LINE TO THE SENSE AMPLIFIER LATCH TO MAINTAIN THE DATA LINE AT THE FIRST VOLTAGE LEVEL — 912

WITH THE DATA LINE BIASED TO THE SECOND VOLTAGE LEVEL, FLOAT THE DATA LINE — 914

```
                                                    ╱─ 908
                                                   ╱

┌────────────────────────────────────────────────────────┐
│ APPLY THE FOURTH VOLTAGE LEVEL PLUS A THRESHOLD VOLTAGE OF THE │
│ TRANSISTOR TO A CONTROL GATE OF THE TRANSISTOR SUCH THAT THE   │──916
│ DATA LINE IS BIASED TO THE FOURTH VOLTAGE LEVEL VIA THE SENSE  │
│              AMPLIFIER AND THE TRANSISTOR                      │
└────────────────────────────────────────────────────────┘
```

FIG. 9E

```
                                                    ╱─ 906
┌────────────────────────────────────────────────────────┐
│ PRIOR TO BIASING THE DATA LINE TO THE THIRD VOLTAGE LEVEL, APPLY A │
│ FIFTH VOLTAGE LEVEL TO A CONTROL GATE OF THE TRANSISTOR SUCH THAT  │──918
│       THE DATA LINE IS BIASED TO THE FOURTH VOLTAGE LEVEL          │
└────────────────────────────────────────────────────────┘
                              │
                              ▼
┌────────────────────────────────────────────────────────┐
│ APPLY A SIXTH VOLTAGE LEVEL GREATER THAN THE FIFTH VOLTAGE LEVEL │
│ TO THE CONTROL GATE OF THE TRANSISTOR TO BIAS THE DATA LINE TO THE │──920
│                    THIRD VOLTAGE LEVEL                          │
└────────────────────────────────────────────────────────┘
```

FIG. 9F

```
                                                    ╱─ 900
┌────────────────────────────────────────────────────────┐
│ WITH THE DATA LINE BIASED TO THE FIRST VOLTAGE LEVEL, THE SECOND │
│ VOLTAGE LEVEL, THE THIRD VOLTAGE LEVEL, OR THE FOURTH VOLTAGE    │──922
│ LEVEL, APPLY A PROGRAM PULSE TO THE SELECTED ACCESS LINE         │
└────────────────────────────────────────────────────────┘
```

FIG. 9G

MEMORY DEVICES WITH FOUR DATA LINE BIAS LEVELS

TECHNICAL FIELD

The present disclosure relates generally to memory and, in particular, in one or more embodiments, the present disclosure relates to programming operations within memory devices using four data line biasing levels.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) may represent a bit pattern of four bits, and 32-level MLC (typically referred to as PLC) may represent a bit pattern of five bits.

A read window, which may be referred to as a read window width, refers to a distance (e.g., in voltage) between adjacent Vt distributions at a particular bit error rate (BER). A read window budget (RWB) may refer to a cumulative value of read windows for a group of programmed cells (e.g., one or more pages of cells). For example, TLC memory cells configured to store three bits of data per cell may be programmed to one of eight different Vt distributions, each corresponding to a respective data state. In this example, the RWB may be the cumulative value (e.g., in voltage) of the seven read windows between the eight Vt distributions.

BRIEF DESCRIPTION OF THE DRAWINGS

FIGS. 7A and 7B are timing diagrams depicting programming operations according to embodiments.

FIGS. 9A-9G are flowcharts of a method of operating a memory in accordance with another embodiment.

DETAILED DESCRIPTION

Figure 1:
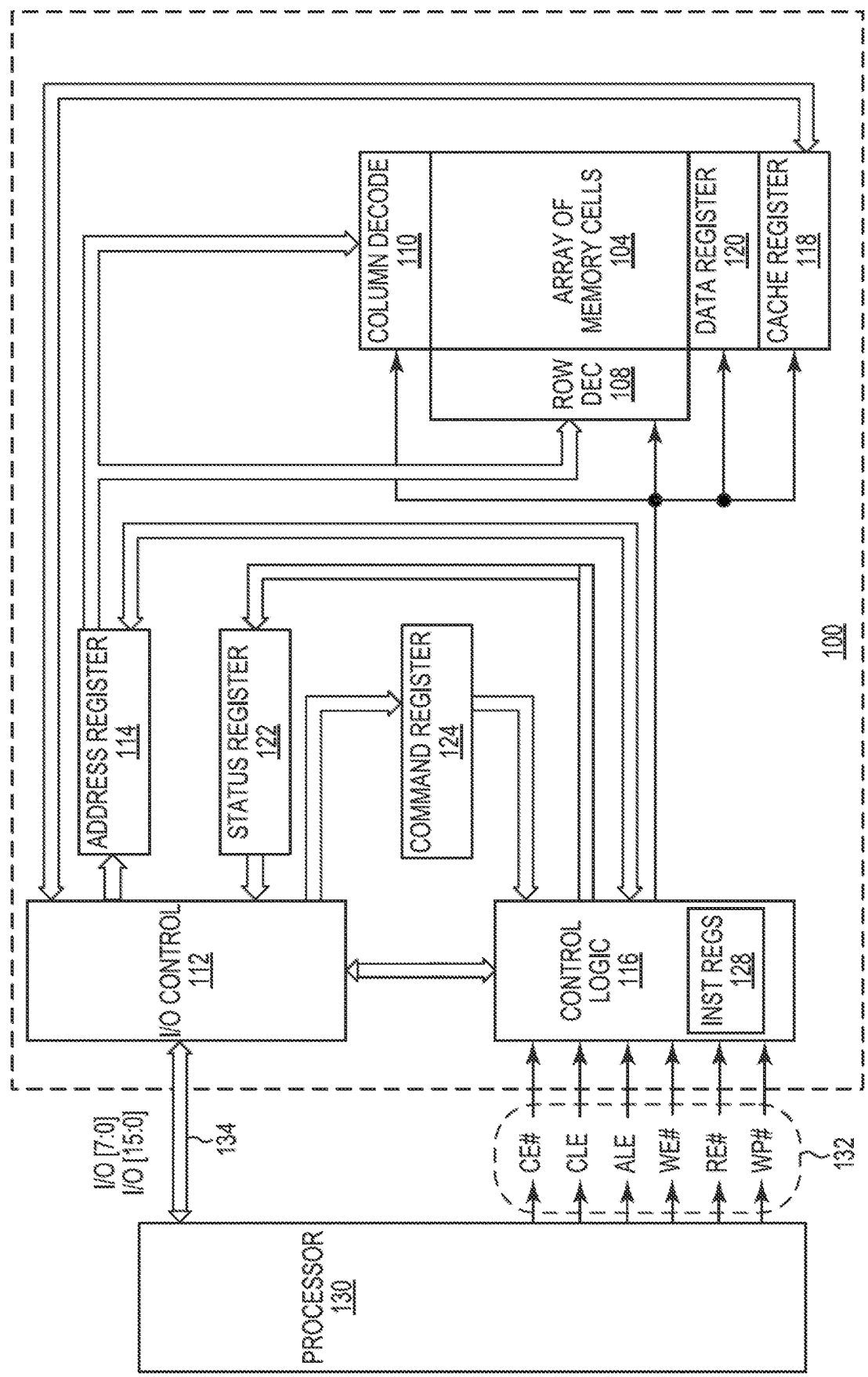
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
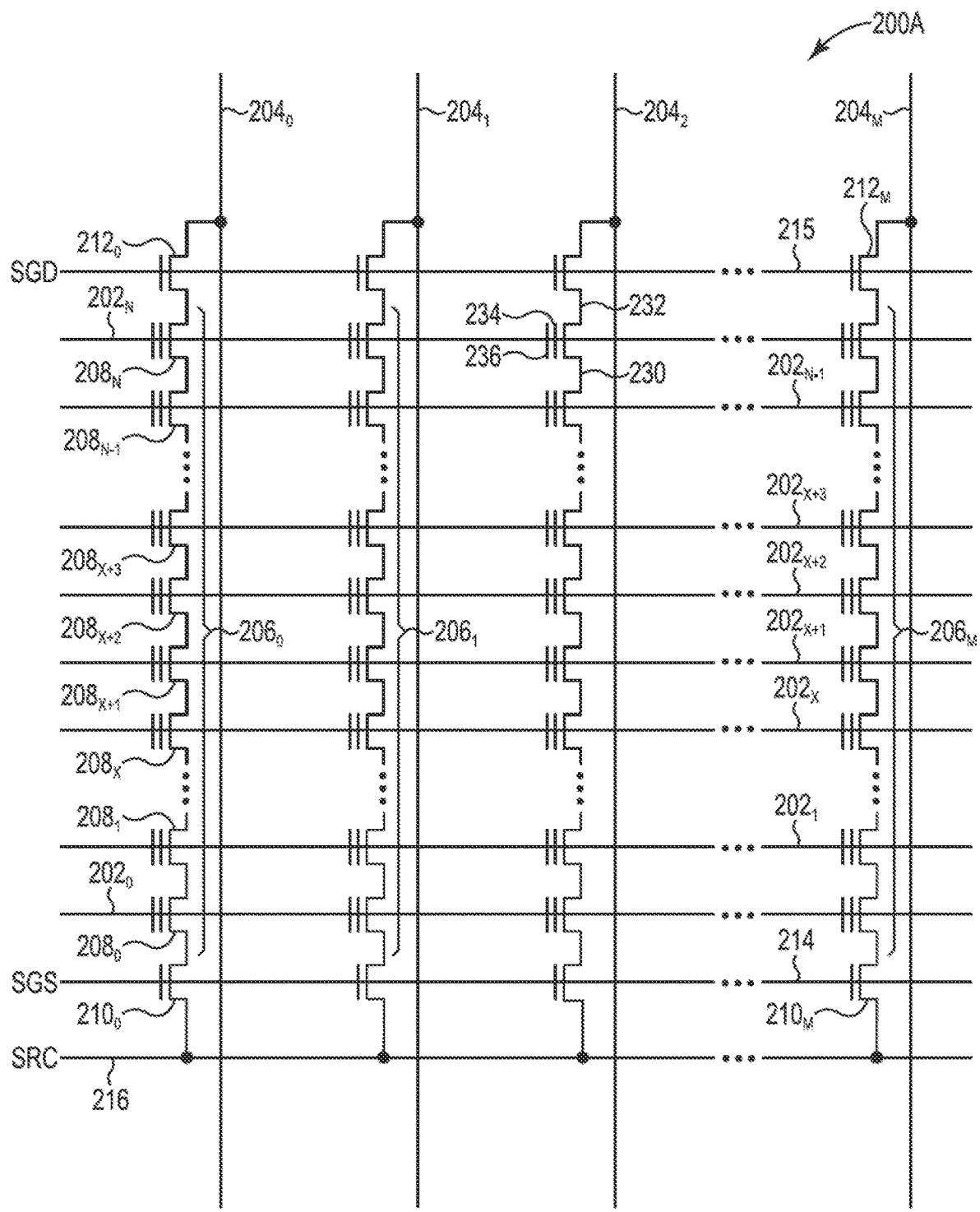
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_m$ (e.g., that might be source select transistors, commonly referred to as select gate source), and a select gate 212 (e.g., a field-effect transistor), such as one of the select gates $212_0$ to $212_m$ (e.g., that might be drain select transistors, commonly referred to as select gate drain). Select gates $210_0$ to $210_m$ might be commonly connected to a select line 214, such as a source select line (SGS), and select gates $212_0$ to $212_m$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
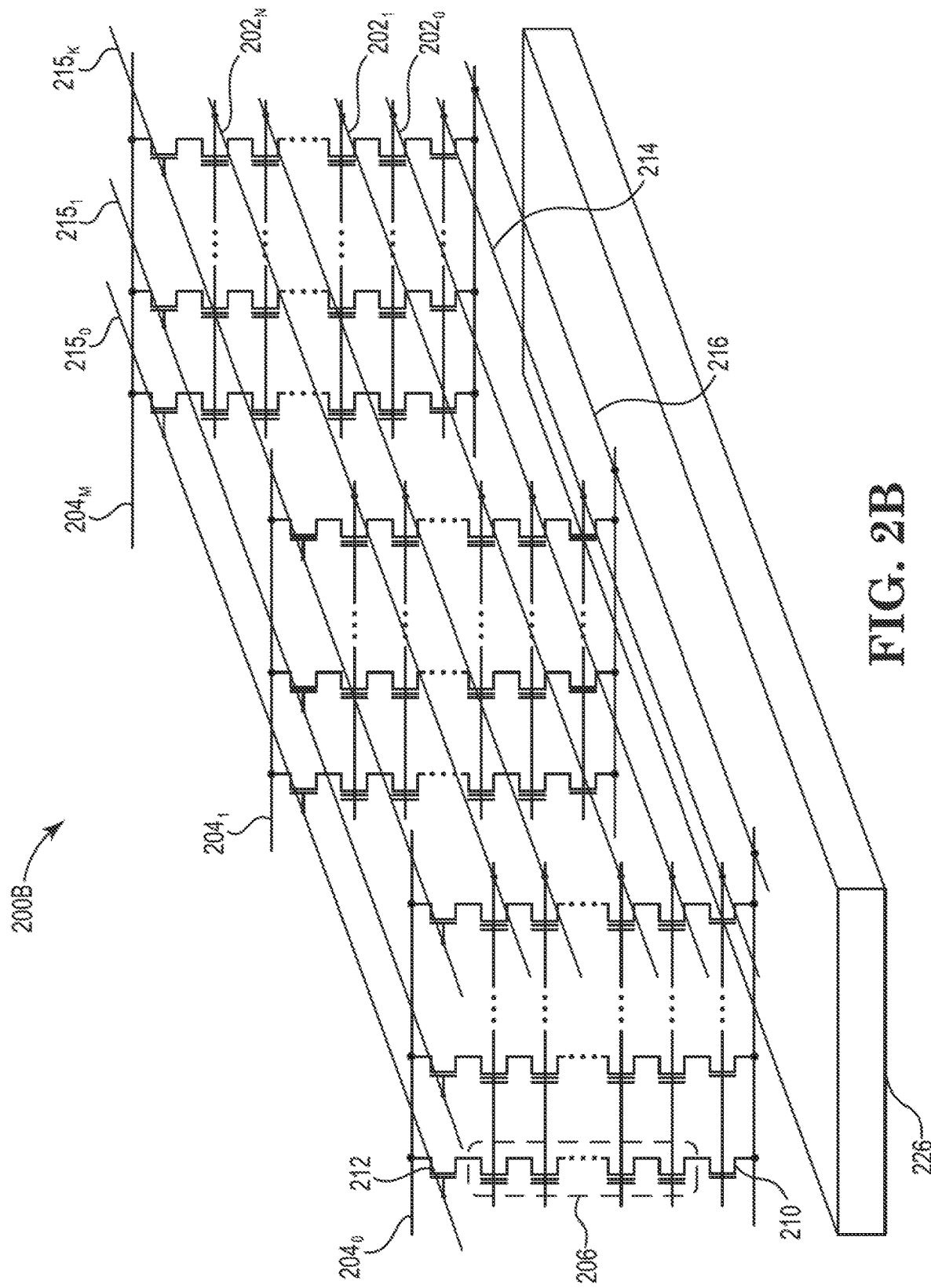

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
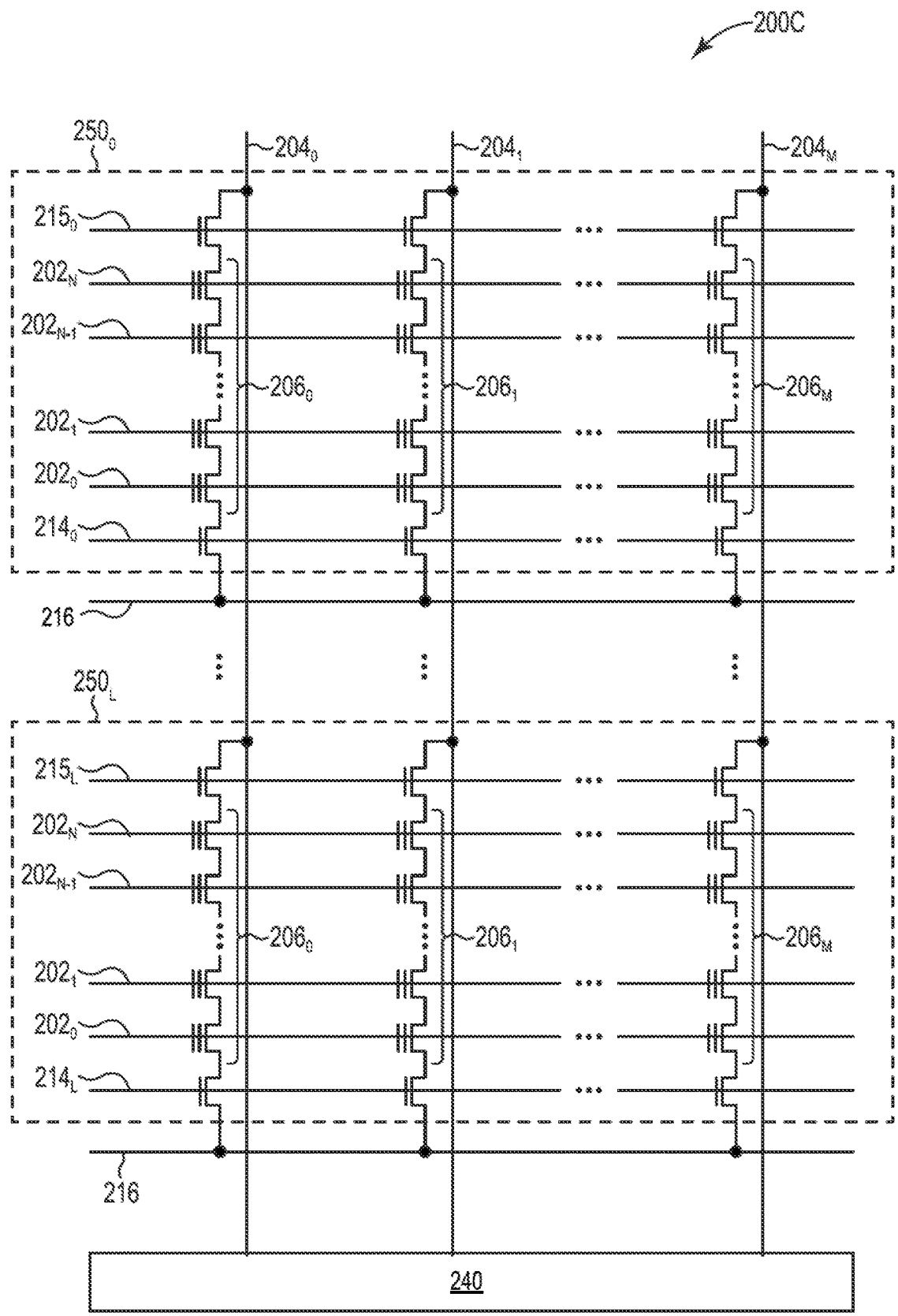

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
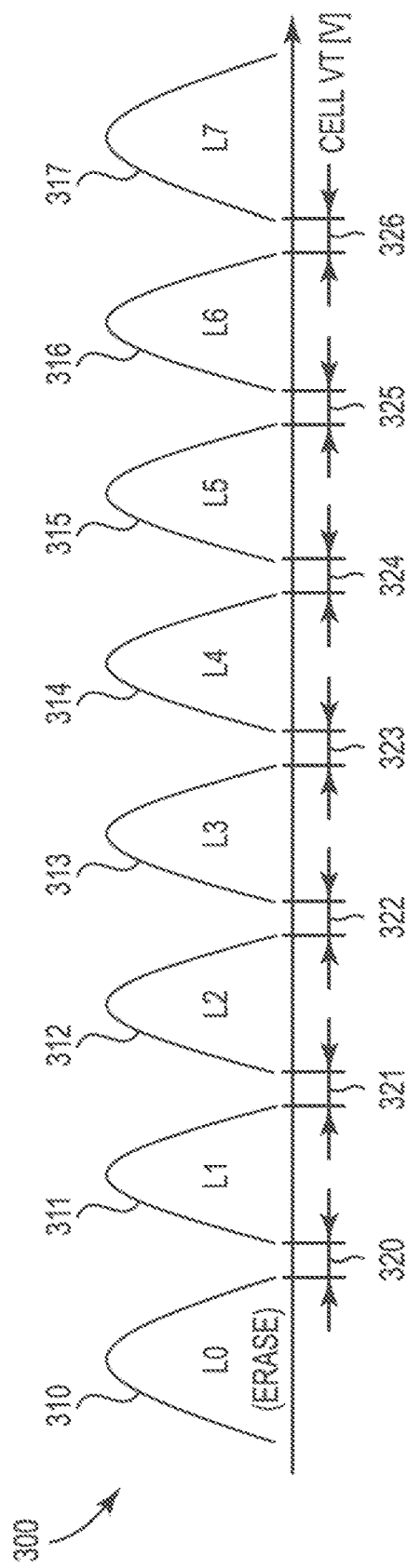
FIG. 3 depicts memory cell populations for a TLC memory according to an embodiment.

FIG. 3 depicts memory cell populations 300 for a memory according to an embodiment. For simplicity, FIG. 3 and the following FIG. 4 will presume programming operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, programming operations performed on lower storage density memory cells, e.g., SLC (two data states) or higher storage density memory cells, e.g., QLC (16 data states) or PLC (32 data states) memory cells, are equally applicable.

In this example, the population of memory cells 310 might be erased memory cells and represent a logical data value of '111', the population of memory cells 311 might represent a logical data value of '011', the population of memory cells 312 might represent a logical data value of '001', the population of memory cells 313 might represent a logical data value of '101', the population of memory cells 314 might represent a logical data value of '100', the population of memory cells 315 might represent a logical data value of '000', the population of memory cells 316 might represent a logical data value of '010', and the population of memory cells 317 might represent a logical data value of '110', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. Although a specific example of binary representation is provided, embodiments may use other arrangements of bit patterns to represent the various data states.

A read window between the population of memory cells 310 and the population of memory cells 311 is indicated at 320, which is the distance (e.g., in voltage) between adjacent Vt distributions for the memory cells representing data states L0 and L1. A read window between the population of memory cells 311 and the population of memory cells 312 is indicated at 321, which is the distance (e.g., in voltage) between adjacent Vt distributions for the memory cells representing data states L1 and L2. Likewise, a read window between the population of memory cells 312, 313, 314, 315, and 316, and the population of memory cells 313, 314, 315, 316, and 317 is indicated at 322, 323, 324, 325, and 326, respectively, which is the distance between adjacent Vt distributions for the memory cells representing data states L2, L3, L4, L5, L6, and L7. A read window budget (RWB) may refer to a cumulative value of read windows for a group of programmed cells (e.g., one or more pages of cells). In this example, the RWB may be the cumulative value (e.g., in voltage) of the seven read windows 320-326 between the eight Vt distributions.

Figure 4:
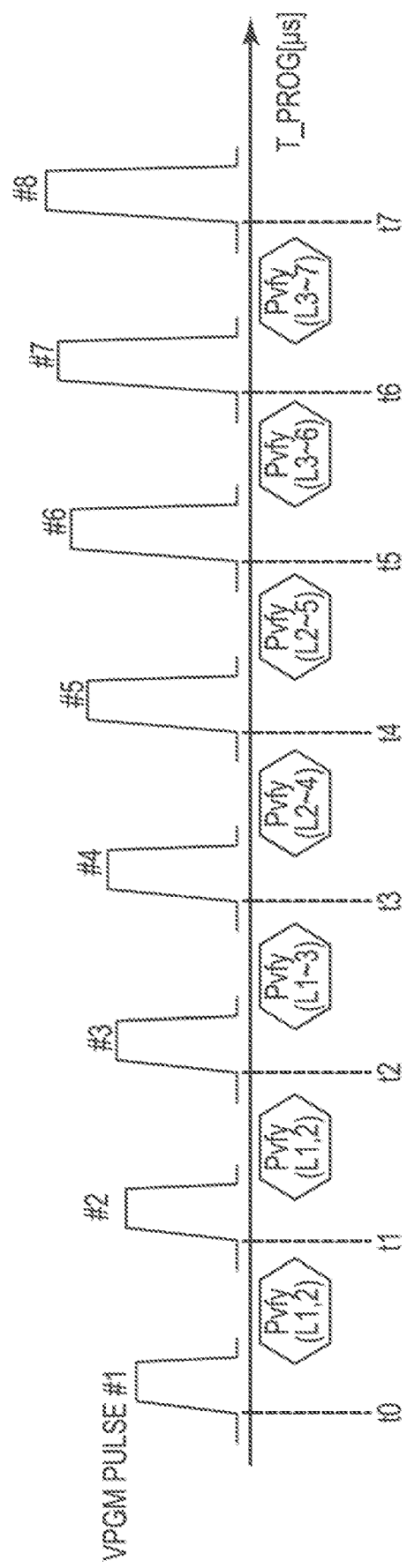
FIG. 4 is a timing diagram depicting a portion of a programming operation to program selected TLC memory cells to target threshold voltages according to an embodiment.

FIG. 4 is a timing diagram depicting a portion of a programming operation to program selected TLC memory cells to target levels L0 to L7 (e.g., as illustrated in FIG. 3) according to an embodiment. Once a selected memory cell has been programmed to its target level, the memory cell is inhibited from further programming. Prior to time to, memory cells selected for programming might be erased such that the selected memory cells each have a threshold voltage corresponding to level L0. At time t0, a first program pulse is applied to a selected access line (e.g., 202 of FIG. 2A) connected to the control gates (e.g., 236) of the selected memory cells (e.g., 208). After the first program pulse, a program verify operation may be performed to verify whether a target population of the selected memory cells has been programmed to level L1 or L2. At time t1, a second program pulse, e.g., higher than the first program pulse, is applied to the selected access line connected to the control gates of the selected memory cells. After the second program pulse, a program verify operation may be performed to verify whether target populations of the selected memory cells have been programmed to level L1 or L2.

At time t2, a third program pulse, e.g., higher than the second program pulse, is applied to the selected access line connected to the control gates of the selected memory cells. After the third program pulse, a program verify operation may be performed to verify whether target populations of the selected memory cells have been programmed to level L1, L2, or L3. At time t3, a fourth program pulse, e.g., higher than the third program pulse, is applied to the selected access line connected to the control gates of the selected memory cells. After the fourth program pulse, a program verify operation may be performed to verify whether target populations of the selected memory cells have been programmed to level L2, L3, or L4. At time t4, a fifth program pulse, e.g., higher than the fourth program pulse, is applied to the selected access line connected to the control gates of the selected memory cells. After the fifth program pulse, a program verify operation may be performed to verify whether target populations of the selected memory cells have been programmed to level L2, L3, L4, or L5.

At time t5, a sixth program pulse, e.g., higher than the fifth program pulse, is applied to the selected access line connected to the control gates of the selected memory cells. After the sixth program pulse, a program verify operation may be performed to verify whether target populations of the selected memory cells have been programmed to level L3, L4, L5, or L6. At time t6, a seventh program pulse, e.g., higher than the sixth program pulse, is applied to the selected access line connected to the control gates of the selected memory cells. After the seventh program pulse, a program verify operation may be performed to verify whether target populations of the selected memory cells have been programmed to level L3, L4, L5, L6, or L7. At time t7, an eighth program pulse, e.g., higher than the seventh program pulse, may be applied to the selected access line connected to the control gates of the selected memory cells and the process may repeat until the selected memory cells have been programmed to their target levels.

Figure 5A:
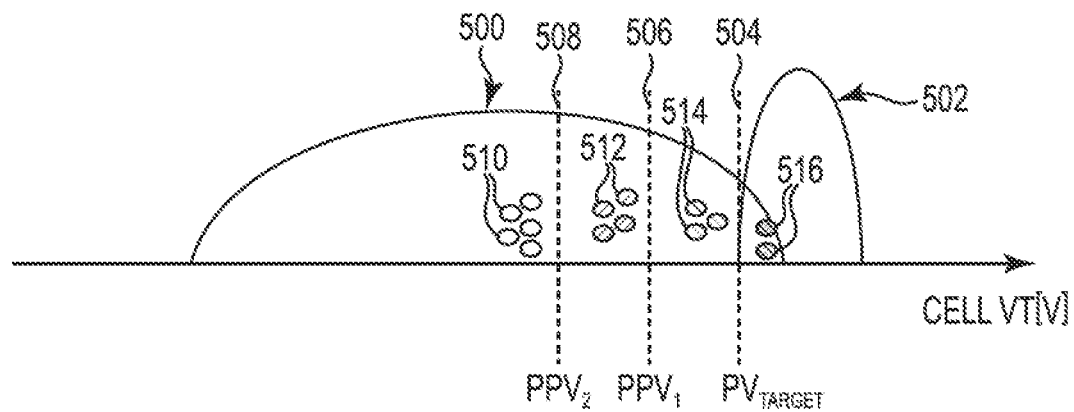
FIGS. 5A and 5B depict a population of memory cells during a programming operation to program selected memory cells to a target level according to an embodiment.

FIG. 5A depicts a population of memory cells 500 after a particular program pulse of a programming operation to program selected memory cells to a target level as indicated by a population of memory cells 502. The use of different voltage levels on data lines to be enabled for programming might occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. The target level may correspond to a minimum threshold voltage ($PV_{TARGET}$) 504 for the target level, which may be referred to as the final program verify level for the target level. A first pre-program verify level ($PPV_1$) 506 may be selected to be less than the final program verify level 504 to enable slow SSPC programming. A second pre-program verify level ($PPV_2$) 508 may be selected to be less than the slow SSPC program verify level 506 to enable fast SSPC programming.

After the particular program pulse, a program verify operation is performed to sense the threshold voltage of each memory cell within the population of memory cells 500. Memory cells having a threshold voltage less than the second pre-program verify level 508 as indicated for example at 510 are biased for non-SSPC programming (e.g., fully enabled for programming). Memory cells having a threshold voltage between the second pre-program verify level 508 and the first pre-program verify level 506 as indicated for example at 512 are biased for fast SSPC programming (e.g., partially enabled for programming at a first rate) since the memory cells fall within the fast SSPC range. Memory cells having a threshold voltage between the first pre-program verify level 506 and the final program verify level 504 as indicated for example at 514 are biased for slow SSPC programming (e.g., partially enabled for programming at a second rate less than the first rate) since the memory cells fall within a slow SSPC range. Memory cells having a threshold voltage greater than the final program verify level 504 as indicated for example at 516 are inhibited from further programming.

Figure 5B:
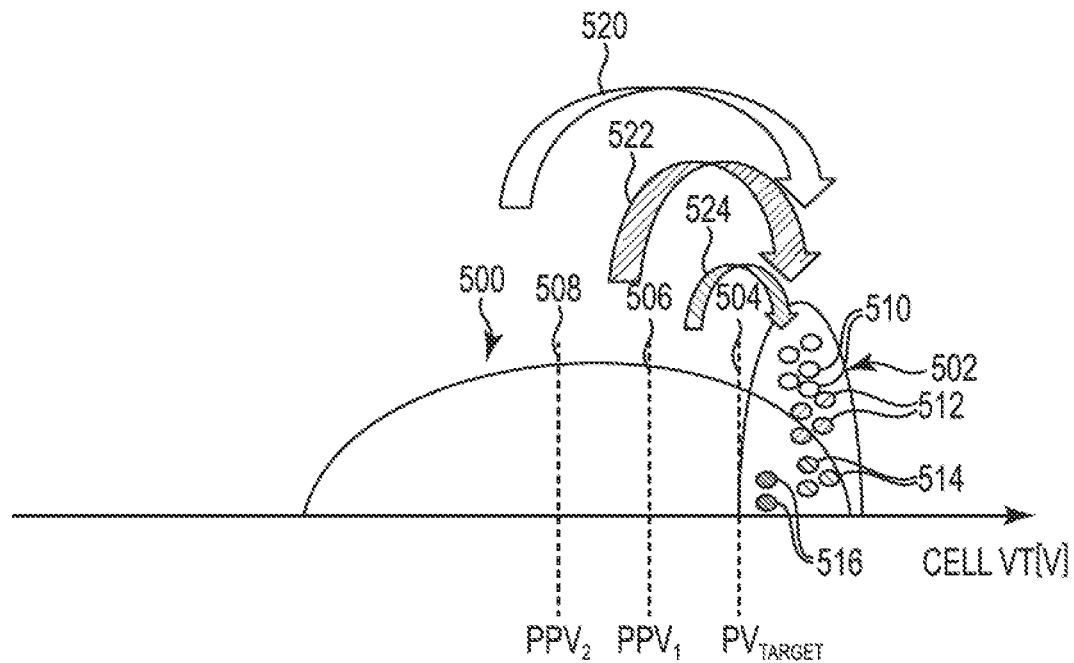

As illustrated in FIG. 5B, with each memory cell within the population of memory cells 500 biased for non-SSPC programming, fast SSPC programming, slow SSPC programming, or inhibited from programming, a subsequent program pulse is applied to the population of memory cells 500 to increase the threshold voltages of the memory cells to the target level as indicated by the population of memory cells 502. The subsequent program pulse may be immediately subsequent to the particular program pulse. With the memory cells 510 biased for non-SSPC programming, the threshold voltages of the memory cells 510 might be increased above the final program verify level 504 as indicated by 520 in response to the subsequent program pulse. With the memory cells 512 biased for fast SSPC programming, the threshold voltages of the memory cells 512 might be increased above the final program verify level 504 as indicated by 522 in response to the subsequent program pulse. With the memory cells 514 biased for slow SSPC programming, the threshold voltages of the memory cells 514 might be increased above the final program verify level 504 as indicated by 524 in response to the subsequent program pulse. After the subsequent program pulse, a program verify operation is performed to sense the threshold voltage of each memory cell within the population of memory cells 502. In this example, all the memory cells have a threshold voltage greater than the final program verify level 504 and are inhibited from further programming.

A memory cell may be biased for fast SSPC programming by biasing the data line connected to the memory cell to a fast SSPC level during the program pulse. A memory cell may be biased for slow SSPC programming by biasing the data line connected to the memory cell to a slow SSPC level during the program pulse. A memory cell may be biased for non-SSPC programming by biasing the data line connected to the memory cell to a non-SSPC level during the program pulse. A memory cell may be inhibited from programming by biasing the data line connected to the memory cell to an inhibit level during the program pulse. The fast SSPC level (e.g., 0.75V) might be greater than the non-SSPC level (e.g., 0V). The slow SSPC level (e.g., 1.5V) might be greater than the fast SSPC level and less than the inhibit level (e.g., 3V). By using four data line bias levels during programming, the number of program pulses used to program selected memory cells to their target levels may be reduced compared to the number of program pulses used to program the selected memory cells to their target levels using less than four data line bias levels, thereby reducing the programming time. In addition, by using four data line bias levels, the programming time may be reduced without reducing the read window budget.

Figure 6:
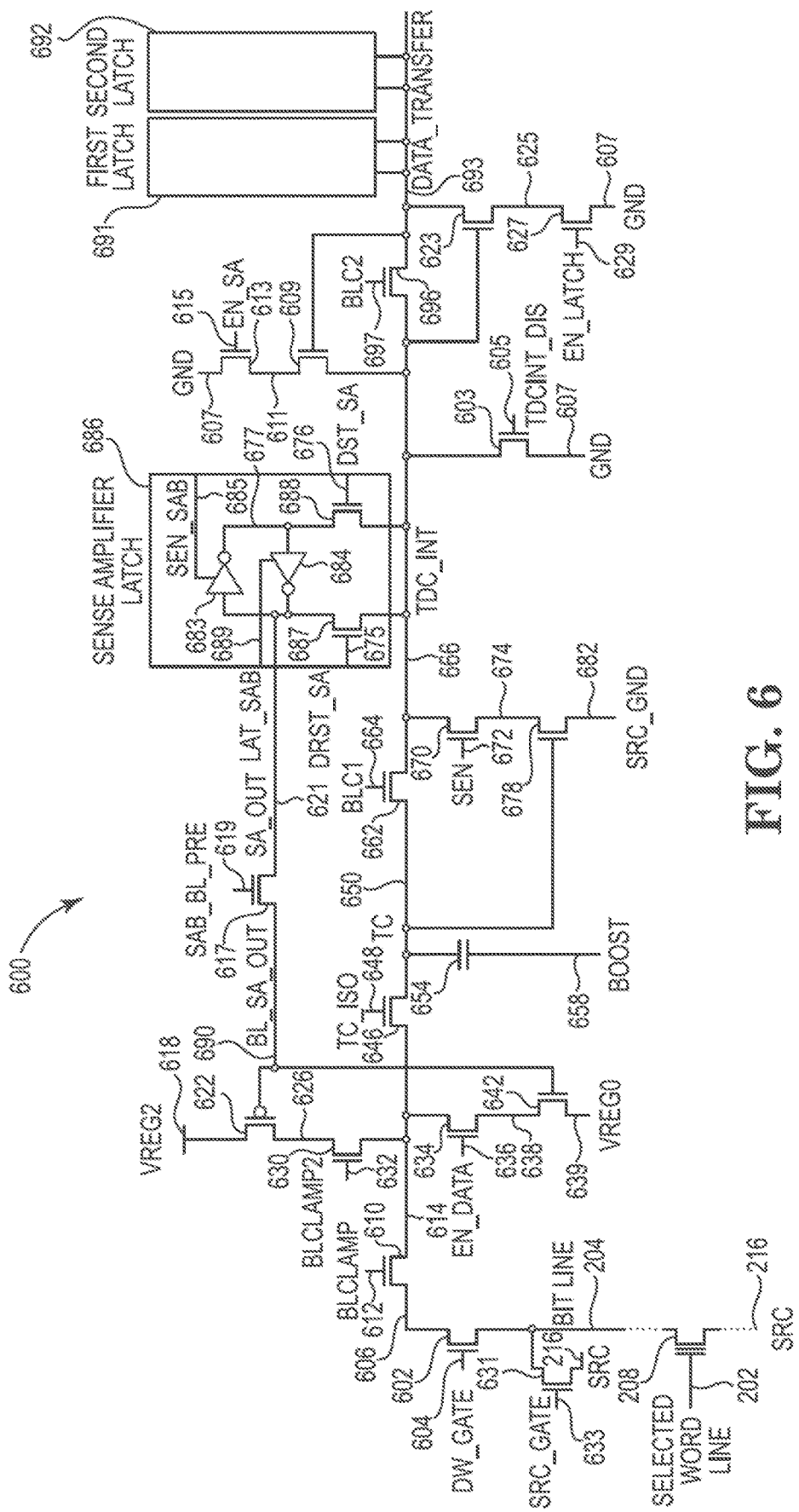
FIG. 6 is a schematic of portions of a page buffer as could be used in a memory of the type described with reference to FIG. 1.

FIG. 6 is a schematic of portions of a page buffer 600 as could be used in a memory of the type described with reference to FIG. 1. Page buffer 600 might be part of buffer portion 240 of FIG. 2C. Page buffer 600 includes a selected access line (e.g., word line) 202, a selected memory cell 208 of a string of series-connected memory cells (not shown), and a selected data line (e.g., bit line) 204. The selected access line 202 is connected to the control gate of the selected memory cell 208. The source of the selected memory cell 208 is connected to the common source 216 (e.g., via other memory cells of the string of series-connected memory cells and a respective select gate 210). The drain of the selected memory cell 208 is connected to the selected data line 204 (e.g., via other memory cells of the string of series-connected memory cells and a respective select gate 212).

Page buffer 600 also includes transistors 602, 603, 609, 610, 613, 617, 622, 623, 627, 630, 631, 634, 642, 646, 662, 670, 678, and 696, a sense capacitor 654, a sense amplifier latch 686, a first latch 691, and a second latch 692. Transistor 622 might be a p-channel metal-oxide-semiconductor (PMOS) transistor, while transistors 602, 603, 609, 610, 613, 617, 623, 627, 630, 631, 634, 642, 646, 662, 670, 678, and 696 might be n-channel metal-oxide-semiconductor (NMOS) transistors. Sense amplifier latch 686 includes inverters 683 and 684 and transistors 687 and 688 (e.g., NMOS transistors). The data line 204 is connected to one side of the source-drain path of transistor 602 and one side of the source-drain path of transistor 631. The gate of transistor 631 is connected to a SRC_GATE control signal path 633. The other side of the source-drain path of transistor 631 is connected to the common source 216. The gate of transistor 602 is connected to a DW_GATE control signal path 604. The other side of the source-drain path of transistor 602 is connected to one side of the source-drain path of transistor 610 through a signal path 606. The gate of transistor 610 is connected to a BLCLAMP control signal path 612. The other side of the source-drain path of transistor 610 is connected to one side of the source-drain path of transistor 630, one side of the source-drain path of transistor 634, and one side of the source-drain path of transistor 646 through a signal path 614. The gate of transistor 630 is connected to a BLCLAMP2 control signal path 632. The other side of the source-drain path of transistor 630 is connected to one side of the source-drain path of transistor 622 through a signal path 626. The gate of transistor 622 is connected to one side of the source-drain path of transistor 617 and the gate of transistor 642 through a BL_SA_OUT signal path 690. The gate of transistor 617 is connected to a SAB_BL_PRE control signal path 619. The other side of the source-drain path of transistor 617 is connected to the input of inverter 683, the output of inverter 684, and one side of the source-drain path of transistor 687 through a SA_OUT signal path 621. The other side of the source-drain path of transistor 622 is connected to a supply node (e.g., VREG2) 618. The gate of transistor 634 is connected to an EN_DATA control signal path 636. The other side of the source-drain path of transistor 634 is connected to one side of the source-drain path of transistor 642 through a signal path 638. The other side of the source-drain path of transistor 642 is connected to a supply node (e.g., VREG0) 639.

The gate of transistor 646 is connected to a TC_ISO control signal path 648. The other side of the source-drain path of transistor 646 is connected to one side of sense capacitor 654, one side of the source-drain path of transistor 662, and the gate of transistor 678 through a TC signal path 650. The other side of sense capacitor 654 is connected to a sense capacitor bias node (e.g., BOOST node) 658. The gate of transistor 662 is connected to a BLC1 control signal path 664. The other side of the source-drain path of transistor 662 is connected to one side of the source-drain path of transistor 670, the other side of the source-drain path of transistor 687, one side of the source-drain path of transistor 688, one side of the source-drain path of transistor 603, one side of the source-drain path of transistor 609, one side of the source-drain path of transistor 696, and the gate of transistor 623 through a TDC_INT signal path 666. The gate of transistor 670 is connected to a SEN control signal path 672. The other side of the source-drain path of transistor 670 is connected to one side of the source-drain path of transistor 678 through a signal path 674. The other side of the source-drain path of transistor 678 is connected to a source bias node (e.g., SRC_GND) 682. The transistor 678 might be referred to as a sense transistor.

The gate of transistor 687 of sense amplifier latch 686 is connected to a DRST_SA control signal path 675. The gate of transistor 688 is connected to a DST_SA signal path 676. The other side of the source-drain path of transistor 688 is connected to the output of inverter 683 and to the input of inverter 684 through a signal path 677. A control input of inverter 683 is connected to a SEN_SAB control signal path 685. A control input of inverter 684 is connected to a LAT_SAB control signal path 689.

The gate of transistor 603 is connected to a TDCINT_DIS control signal path 605. The other side of the source-drain path of transistor 603 is connected to a common or ground (e.g., GND) node 607. The gate of transistor 609 is connected to the other side of the source-drain path of transistor 696, one side of the source-drain path of transistor 623, first latch 691, and second latch 692 through a DATA_TRANSFER signal path 693. The other side of the source-drain path of transistor 609 is connected to one side of the source-train path of transistor 613 through a signal path 611. The gate of transistor 613 is connected to an EN_SA control signal path 615. The other side of the source-drain path of transistor 613 is connected to the common or ground node 607. The gate of transistor 696 is connected to a BLC2 control signal path 697. The other side of the source-drain path of transistor 623 is connected to one side of the source-drain path of transistor 627 through a signal path 625. The gate of transistor 627 is connected to an EN_LATCH control signal path 629. The other side of the source-drain path of transistor 627 is connected to the common or ground node 607.

Control logic (e.g., 116 of FIG. 1) might be connected to the SRC_GATE control signal path 633, the DW_GATE control signal path 604, the BLCLAMP control signal path 612, the BLCLAMP2 control signal path 632, the EN_DATA control signal path 636, the TC_ISO control signal path 648, the BLC1 control signal path 664, the SEN control signal path 672, the SAB_BL_PRE control signal path 619, the LAT_SAB control signal path 689, the SEN_SAB control signal path 685, the DRST_SA control signal path 675, the DST_SA control signal path 676, the TDCINT_DIS control signal path 605, the EN_SA control signal path 615, the BCL2 control signal path 697, and the EN_LATCH control signal path 629 to control the operation of page buffer 600. The control logic may activate transistor 631 to selectively connect the data line 204 to the common source 216. The control logic may activate transistor 602 to selectively connect the data line 204 to the signal path 606. The control logic may activate transistor 610 to selectively connect the signal path 606 to the signal path 614. The control logic may activate transistor 630 to selectively connect the signal path 614 to the signal path 626. The control logic may activate transistor 634 to selectively connect the signal path 614 to the signal path 638.

The control logic may activate transistor 617 to selectively connect the SA_OUT signal path 621 to the BL_SA_OUT signal path 690. The control logic may activate transistor 646 to selectively connect the signal path 614 to the TC signal path 650. The control logic may activate transistor 662 to selectively connect the TC signal path 650 to the TDC_INT signal path 666. The control logic may activate transistor 670 to selectively connect the TDC_INT signal path 666 to the signal path 674. The control logic may activate transistor 687 of sense amplifier latch 686 to selectively connect the TDC_INT signal path 666 to the SA_OUT signal path 621. The control logic may activate transistor 688 to selectively connect the TDC_INT signal path 666 to the signal path 677. The control logic may control inverter 683 to latch a sensed state of the selected memory cell in sense amplifier latch 686. The control logic may control inverter 684 to output the latched state from the sense amplifier latch 686. The control logic may activate transistor 603 to selectively connect the TDC_INT signal path 666 to the common or ground node 607. The control logic may activate transistor 696 to selectively connect the TDC_INT signal path 666 to the DATA_TRANSFER signal path 693. The control logic may activate transistor 613 to selectively connect the signal path 611 to the common or ground node 607. The control logic may activate transistor 627 to selectively connect the signal path 625 to the common or ground node 607.

Page buffer 600 may be used to sense the state of the selected memory cell 208 and latch the sensed state in sense amplifier latch 686 during a read operation or a program verify operation. Page buffer 600 may also be used to program a target state to the selected memory cell 208 based on a state of the sense amplifier latch 686, a state of the first latch 691, a state of the second latch 692, and/or the state of additional latches (not shown). After each program verify operation, a first data bit stored in first latch 691 and a second data bit stored in second latch 692 may be updated to indicate whether the data line 204 is biased for non-SSPC programming, fast SSPC programming, slow SSPC programming, or inhibited from programming during the next program pulse. Program operations to program the selected memory cell 208 to a target level are described in more detail below with reference to FIGS. 7A and 7B.

The biasing of data line 204 for non-SSPC programming, fast SSPC programming, slow SSPC programing, or inhibiting from programming based on the data bits stored in the first latch 691 and the second latch 692 may be implemented in three phases as shown in the below three tables. In each table, the first latch field indicates the data bit stored in the first latch 691, the second latch field indicates the data bit stored in the second latch 692, and the BL mode field indicates whether the data line is biased for a program, inhibit, slow SSPC, or fast SSPC mode. In addition, the BL level field indicates the voltage level applied to the data line 204, the BL_SA_OUT field indicates the state of the signal on the BL_SA_OUT signal path 690, the SA_OUT field indicates the state of the signal on the SA_OUT signal path 621, and the origin field indicates the source of the BL_SA_OUT state or the SA_OUT state. In the origin field, L1 refers to the first latch 691 and L2 refers to the second latch 692. In the BL level field, SSPC_S refers to the voltage level for biasing the data line 204 for slow SSPC programming and SSPC_F refers to the voltage level for biasing the data line for fast SSPC programming.

TABLE 1

Phase 1 of Programming Operation

| FIRST LATCH | SECOND LATCH | BL MODE | BL LEVEL | BL_SA_OUT | ORIGIN |
| --- | --- | --- | --- | --- | --- |
| 0 | 0 | Program | VSS | 1 | L1 |
| 1 | 0 | Inhibit | VCC | 0 | L1 |
| 0 | 1 | Slow SSPC | VSS | 1 | L1 |
| 1 | 1 | Fast SSPC | VSS | 1 | L1 |

TABLE 2

Phase 2 of Programming Operation

| FIRST LATCH | SECOND LATCH | BL MODE | BL LEVEL | BL_SA_OUT | ORIGIN |
| --- | --- | --- | --- | --- | --- |
| 0 | 0 | Program | VSS | 1 → 0 | L1/L2 |
| 1 | 0 | Inhibit | VCC | 0 | L1/L2 |
| 0 | 1 | Slow SSPC | SSPC_S | 1 | L1/L2 |
| 1 | 1 | Fast SSPC | VSS | 1 | L1/L2 |

TABLE 3

Phase 3 of Programming Operation

| FIRST LATCH | SECOND LATCH | BL MODE | BL LEVEL | SA_OUT | ORIGIN |
| --- | --- | --- | --- | --- | --- |
| 0 | 0 | Program | VSS | 0 | L1/L2 |
| 1 | 0 | Inhibit | VCC | 1 | L1/L2 |
| 0 | 1 | Slow SSPC | SSPC_S | 1 | L1/L2 |
| 1 | 1 | Fast SSPC | SSPC_F | 1 | L1/L2 |

FIG. 7A is a timing diagram 700A depicting a programming operation according to embodiments. In FIG. 7A, trace 702 might represent the voltage level on the data line 204 of FIG. 6. Trace 704 might represent the voltage level applied to the VREG0 node 639 of FIG. 6. Trace 706 might represent a TC_ISO control signal on signal path 648 of FIG. 6. Trace 708 might represent a BLCLAMP2 control signal on signal path 632 of FIG. 6. Trace 710 might represent a SAB_BL_PRE control signal on signal path 619 of FIG. 6. In other embodiments, trace 706 might represent a BLC1 control signal on signal path 664 or a DRST_SA control signal on signal path 675 of FIG. 6.

At time t0, phase 1 of the programming operation as outlined in Table 1 above begins. During phase 1, GND is applied to the VREG0 node. GND is applied to the TC_ISO control signal path to disconnect signal path 614 from the TC signal path 650. The voltage applied to the BLCLAMP2 control signal path is increased from GND to a voltage (e.g., VSG) sufficient to activate transistor 630 to connect signal path 614 to signal path 626. A voltage (e.g., VSG) sufficient to activate transistor 617 is applied to the SAB_BL_PRE control signal path to connect the SA_OUT signal path 621 to the BL_SA_OUT signal path 690. The data bits stored in the first latch 691 and the second latch 692 determine the state of the SA_OUT signal on signal path 621 and thus the state of the BL_SA_OUT signal on signal path 690. As indicated by Table 1, BL_SA_OUT is a logic "1" (e.g., VCC) for the program, slow SSPC, and fast SSPC BL modes, and logic "0" (e.g., GND) for the inhibit BL mode.

In response to the first latch storing a data bit equal to 0 and the second latch storing a data bit equal to 0 indicating the program BL mode, the data line 204 is biased to a first voltage level (e.g., VSS or GND) as indicated at 720. In response to the first latch storing a data bit equal to 0 and the second latch storing a data bit equal to 1 indicating the slow SSPC BL mode, the data line 204 is also biased to the first voltage level as indicated at 720. In response to the first latch storing a data bit equal to 1 and the second latch storing a data bit equal to 1 indicating the fast SSPC BL mode, the data line 204 is also biased to the first voltage level as indicated at 720. The data line 204 is biased to the first voltage level via VREG0 node 639 through activated transistors 602, 610, 634, and 642.

In response to the first latch storing a data bit equal to 1 and the second latch storing a data bit equal to 0 indicating the inhibit BL mode, the data line 204 is biased to a second voltage level (e.g., VCC) as indicated at 722. The data line 204 is biased to the second voltage level via VREG2 node 618 (with VCC applied to the VREG2 node 618) through activated transistors 602, 610, 630, and 622.

At time t1, phase 1 of the programming operation is complete and phase 2 of the programming operation begins as outlined in Table 2 above. During phase 2, a third voltage level (e.g., SSPC_S) might be applied to the VREG0 node. GND remains applied to the TC_ISO control signal path. The voltage applied to the BLCLAMP2 control signal path is decreased to a voltage (e.g., GND) sufficient to deactivate transistor 630 to disconnect signal path 614 from signal path 626. The voltage (e.g., VSG) sufficient to activate transistor 617 remains applied to the SAB_BL_PRE control signal path. During phase 2, as indicated by Table 2, BL_SA_OUT changes from a logic "1" to a logic "0" for the program BL mode. For the inhibit, slow SSPC, and fast SSPC BL modes, BL_SA_OUT remains constant. Accordingly, for the program and fast SSPC BL modes, the data line 204 is floated at GND as indicated at 724. For the slow SSPC BL mode, the data line 204 is biased to SSPC_S as indicated at 726. For the inhibit BL mode, the data line 204 is floated at VCC as indicated at 728. There might be a delay (TDELAY) between the increase in the voltage level of the VREG0 node to SSPC_S and phase 3 of the programming operation at time t2 to mitigate capacitive coupling between the data line 204 and adjacent data lines.

At time t2, phase 2 of the programming operation is complete and phase 3 of the programming operation begins as outlined in Table 3 above. During phase 3, SSPC_S might remain applied to the VREG0 node. For the fast SSPC BL mode, a fourth voltage level (e.g., SSPC_F) plus the threshold voltage (VTN) of transistor 646 might be applied to the TC_ISO control signal path. The voltage applied to the BLCLAMP2 control signal path remains at a voltage (e.g., GND) sufficient to deactivate transistor 630. The voltage applied to the SAB_BL_PRE control signal path is decreased to a voltage (e.g., GND) sufficient to deactivate transistor 617 to disconnect the BL_SA_OUT signal path 690 from the SA_OUT signal path 621. During phase 3, as indicated by Table 2, SA_OUT is logic "0" for the program BL mode and logic "1" for the inhibit, slow SSPC, and fast SSPC BL modes. Accordingly, for the program BL mode, the data line 204 is biased to the first voltage level VSS or GND via the sense amplifier latch 686 as indicated at 730. For the slow SSPC BL mode, the data line 204 remains biased to the third voltage level SSPC_S. For the inhibit BL mode, the data line 204 remains floated at the second voltage level VCC. For the fast SSPC mode, the data line 204 is biased to the fourth voltage level SSPC_F via the sense amplifier latch 686 and transistor 646 as indicated at 732.

FIG. 7B is a timing diagram 700B depicting a programming operation according to other embodiments. The programming operation depicted in FIG. 7B may be used to mitigate capacitive coupling between data lines. In addition to traces 702, 704, 706, 708, and 710 of FIG. 7A, in FIG. 7B trace 712 might represent a BLCLAMP control signal on signal path 612 of FIG. 6. In other embodiments, trace 712 might represent an EN_DATA control signal on signal path 636 of FIG. 6. At time t0, phase 1 of the programming operation begins. During phase 1, GND is applied to the VREG0 node. GND is applied to the TC_ISO control signal path to disconnect signal path 614 from the TC signal path 650. The voltage applied to the BCLAMP control signal path and the BLCLAMP2 control signal path is increased from GND to a voltage (e.g., VSG) sufficient to activate transistors 610 and 630 to connect signal path 606 to signal path 626. A voltage (e.g., VSG) sufficient to activate transistor 617 is applied to the SAB_BL_PRE control signal path to connect the SA_OUT signal path 621 to the BL_SA_OUT signal path 690. The data bits stored in the first latch 691 and the second latch 692 determine the state of the SA_OUT signal on signal path 621 and thus the state of the BL_SA_OUT signal on signal path 690.

In response to the first latch storing a data bit equal to 0 and the second latch storing a data bit equal to 0 indicating the program BL mode, the data line 204 is biased to a first voltage level (e.g., VSS or GND) as indicated at 740. In response to the first latch storing a data bit equal to 0 and the second latch storing a data bit equal to 1 indicating the slow SSPC BL mode, the data line 204 is also biased to the first voltage level as indicated at 740. In response to the first latch storing a data bit equal to 1 and the second latch storing a data bit equal to 1 indicating the fast SSPC BL mode, the data line 204 is also biased to the first voltage level as indicated at 740. The data line 204 is biased to the first voltage level via VREG0 node 639 through activated transistors 602, 610, 634, and 642.

In response to the first latch storing a data bit equal to 1 and the second latch storing a data bit equal to 0 indicating the inhibit BL mode, the data line level is biased to a second voltage level (e.g., VCC) as indicated at 742. The data line 204 is biased to the second voltage level via VREG2 node 618 (with VCC applied to the VREG2 node 618) through activated transistors 602, 610, 630, and 622.

At time t1, phase 1 of the programming operation is complete and phase 2 of the programming operation begins. During phase 2, VCC might be applied to the VREG0 node. GND remains applied to the TC_ISO control signal path. The voltage applied to the BLCLAMP2 control signal path is decreased to a voltage (e.g., GND) sufficient to deactivate transistor 630 to disconnect signal path 614 from signal path 626. The voltage applied to the BLCLAMP control signal path is decreased to a voltage SSPC+VTN, which might be equal to the voltage level SSPC_F plus the threshold voltage of transistor 610. The voltage (e.g., VSG) sufficient to activate transistor 617 remains applied to the SAB_BL_PRE control signal path. Accordingly, for the program and fast SSPC BL modes, the data line 204 is floated at GND as indicated at 744. For the slow SSPC BL mode, the data line 204 is biased to SSPC as indicated at 746. For the inhibit BL mode, the data line 204 is floated at VCC as indicated at 748. There might be a delay (TDELAY) between the increase in the voltage level of the VREG0 node to VCC and phase 3 of the programming operation at time t2 to mitigate capacitive coupling between the data line 204 and adjacent data lines.

At time t2, phase 2 of the programming operation is complete and phase 3 of the programming operation begins. During phase 3, VCC might remain applied to the VREG0 node. For the fast SSPC BL mode, SSPC_F plus the threshold voltage (VTN) of transistor 646 might be applied to the TC_ISO control signal path. The voltage applied to the BLCLAMP2 control signal path remains at a voltage (e.g., GND) sufficient to deactivate transistor 630. The voltage applied to the BLCLAMP control signal path may be increased to SSPC_S plus the threshold voltage (VTN) of transistor 610. The voltage applied to the SAB_BL_PRE control signal path is decreased to a voltage (e.g., GND) sufficient to deactivate transistor 617 to disconnect the BL_SA_OUT signal path 690 from the SA_OUT signal path 621. Accordingly, for the program BL mode, the data line 204 is biased to VSS or GND via the sense amplifier latch 686 as indicated at 750. For the slow SSPC BL mode, the data line 204 is biased to SSPC_S as indicated at 752. For the inhibit BL mode, the data line 204 remains floated at VCC. For the fast SSPC mode, the data line 204 is biased to SSPC_F via the sense amplifier latch 686 and transistor 646 as indicated at 754.

FIGS. 8A-8G are flowcharts of a method 800 of operating a memory in accordance with an embodiment. Method 800 may correspond at least in part to FIGS. 6-7B. For example, FIGS. 8A-8G might represent a method of programming one or more memory cells, e.g., a logical page of memory cells. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 8A:
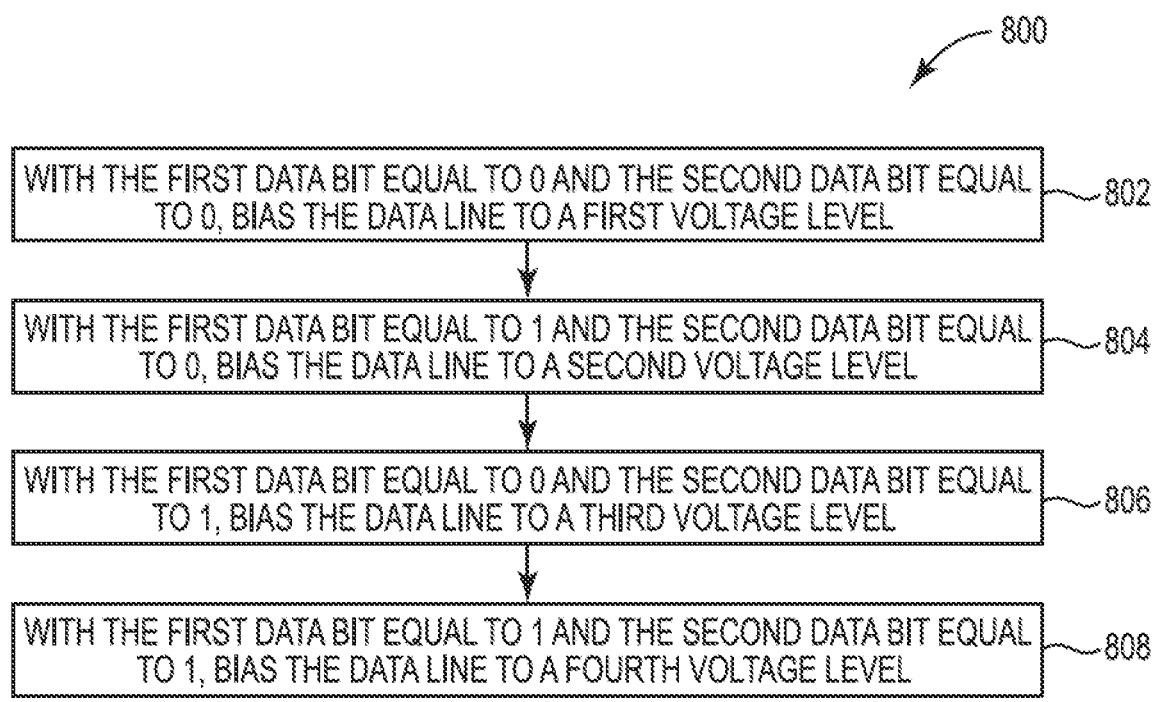
FIGS. 8A-8G are flowcharts of a method of operating a memory in accordance with an embodiment.

Method 800 might be implemented within a memory device (e.g., 100) including a first latch (e.g., 691) to store a first data bit; a second latch (e.g., 692) to store a second data bit; a data line (e.g., 204) selectively connected to the first latch, the second latch, and a string of series-connected memory cells (e.g., 206); and a controller (e.g., 116) configured to bias the data line during a programming operation of a selected memory cell of the string of series-connected memory cells connected to a selected access line (e.g., 202) as previously described at least with reference to FIGS. 1-2C and 6. As illustrated in FIG. 8A at 802, the controller may with the first data bit equal to 0 and the second data bit equal to 0, bias the data line to a first voltage level. At 804, the controller may with the first data bit equal to 1 and the second data bit equal to 0, bias the data line to a second voltage level. At 806, the controller may with the first data bit equal to 0 and the second data bit equal to 1, bias the data line to a third voltage level. At 808, the controller may with the first data bit equal to 1 and the second data bit equal to 1, bias the data line to a fourth voltage level.

The first voltage level might be less than the second voltage level, the third voltage level might be between the first voltage level and the second voltage level, and the fourth voltage level might be between the first voltage level and the third voltage level. The first voltage level might be a program voltage level (e.g., VSS), the second voltage level might be an inhibit voltage level (e.g., VCC), the third voltage level might be a slow selective slow program convergence voltage level (e.g., SSPC_S), and the fourth voltage level might be a fast selective slow program convergence voltage level (e.g., SSPC_F). In one embodiment, the third voltage level might be halfway between the first voltage level and the second voltage level, and the fourth voltage level might be halfway between the first voltage level and the third voltage level.

Figure 8B:
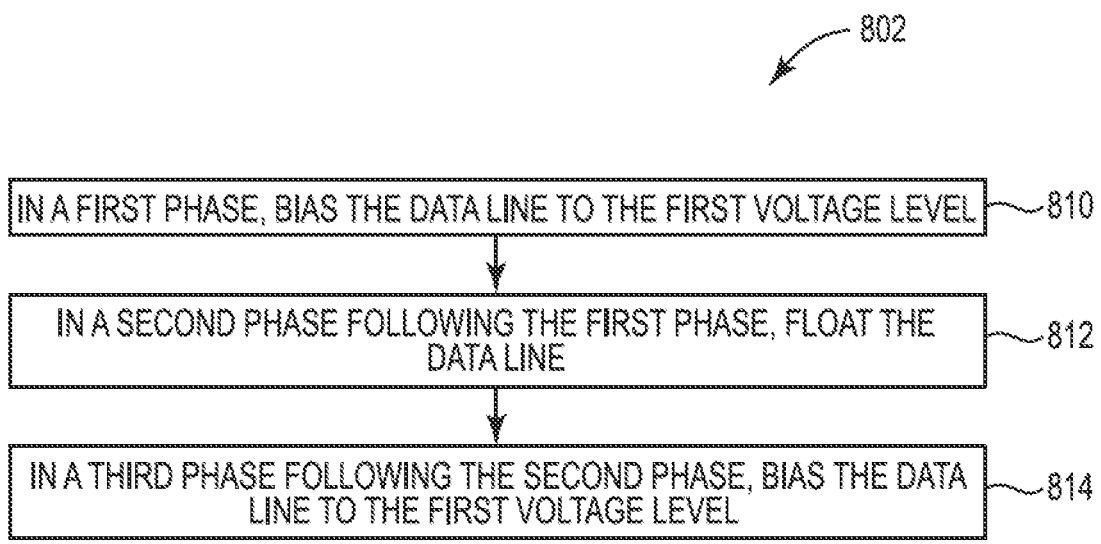

FIG. 8B illustrates additional details that might be implemented by the controller with the first data bit equal to 0 and the second data bit equal to 0 according to an embodiment. At 810, the controller may further in a first phase, bias the data line to the first voltage level. At 812, the controller may further in a second phase following the first phase, float the data line. At 814, the controller may in a third phase following the second phase, bias the data line to the first voltage level.

Figure 8C:
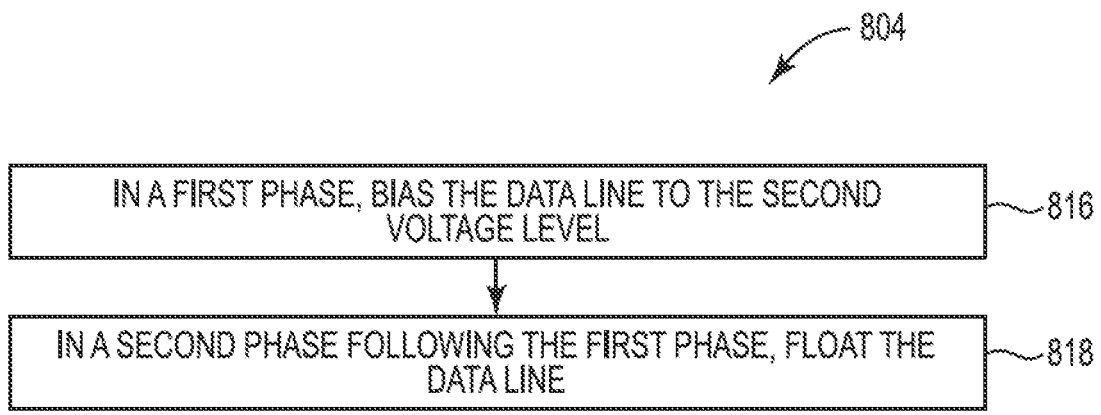

FIG. 8C illustrates additional details that might be implemented by the controller with the first data bit equal to 1 and the second data bit equal to 0 according to an embodiment. At 816, the controller may further in a first phase, bias the data line to the second voltage level. At 818, the controller may further in a second phase following the first phase, float the data line.

Figure 8D:
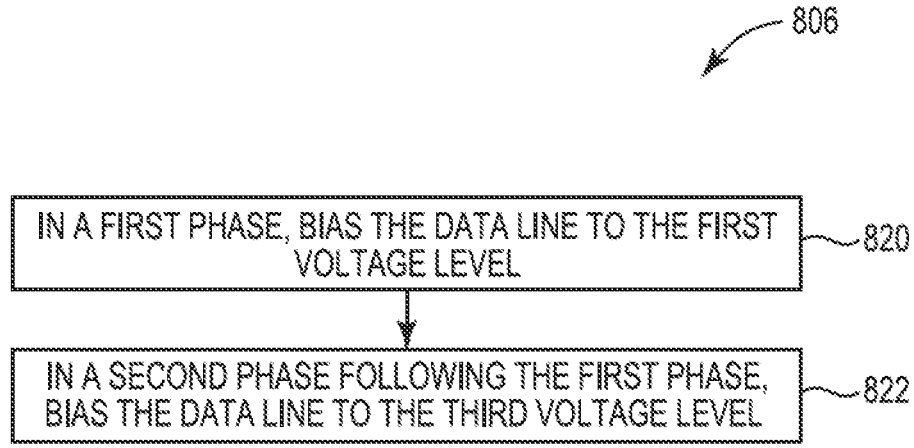

FIG. 8D illustrates additional details that might be implemented by the controller with the first data bit equal to 0 and the second data bit equal to 1 according to an embodiment. At 820, the controller may further in a first phase, bias the data line to the first voltage level. At 822, the controller may further in a second phase following the first phase, bias the data line to the third voltage level.

Figure 8E:
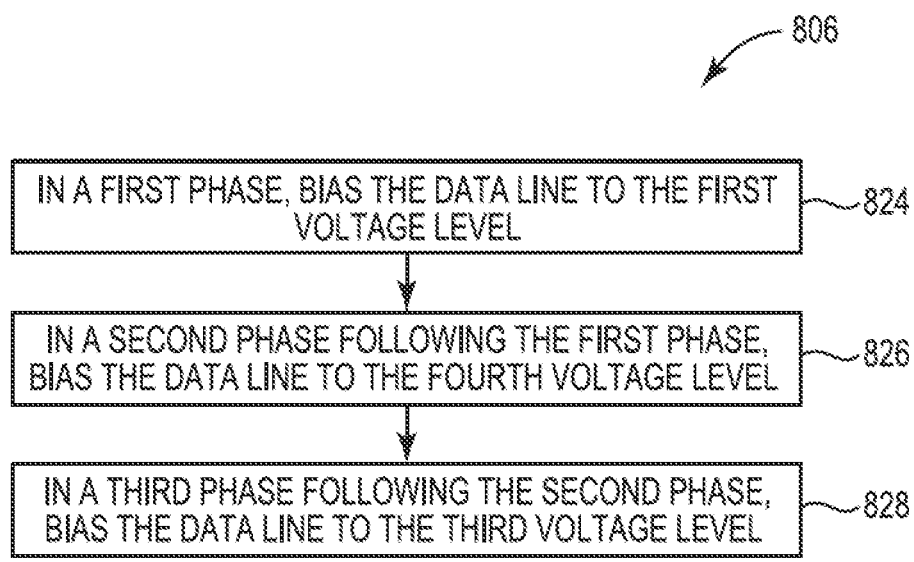

FIG. 8E illustrates additional details that might be implemented by the controller with the first data bit equal to 0 and the second data bit equal to 1 according to another embodiment. At 824, the controller may further in a first phase, bias the data line to the first voltage level. At 826, the controller may further in a second phase following the first phase, bias the data line to the fourth voltage level. At 828, the controller may further in a third phase following the second phase, bias the data line to the third voltage level.

Figure 8F:
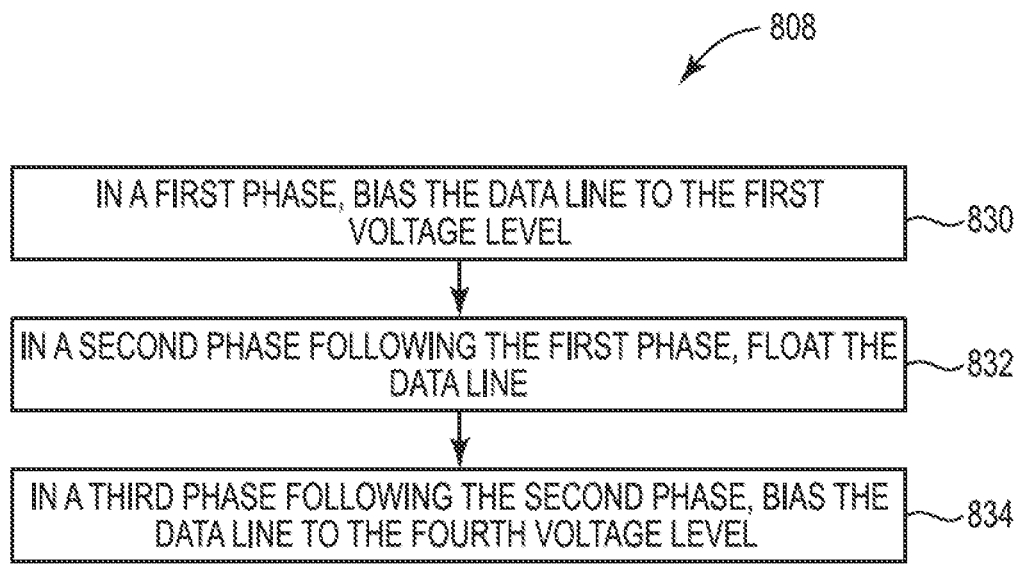

FIG. 8F illustrates additional details that might be implemented by the controller with the first data bit equal to 1 and the second data bit equal to 1 according to an embodiment. At 830, the controller may further in a first phase, bias the data line to the first voltage level. At 832, the controller may further in a second phase following the first phase, float the data line. At 834, the controller may further in a third phase following the second phase, bias the data line to the fourth voltage level.

Figure 8G:
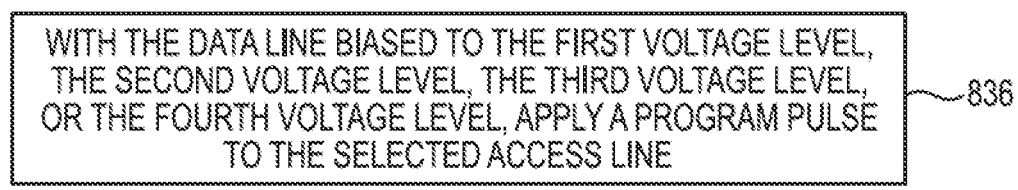

As illustrated in FIG. 8G at 836, the controller may further with the data line biased to the first voltage level, the second voltage level, the third voltage level, or the fourth voltage level, apply a program pulse to the selected access line.

FIGS. 9A-9G are flowcharts of a method 900 of operating a memory in accordance with an embodiment. Method 900 may correspond at least in part to FIGS. 6-7B. For example, FIGS. 9A-9G might represent a method of programming one or more memory cells, e.g., a logical page of memory cells.

The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 900 might be implemented within a memory device (e.g., 100) including a first latch (e.g., 691) to store a first data bit; a second latch (e.g., 692) to store a second data bit; a first node (e.g., 639) configured to receive a selected one of a first voltage level and a third voltage level greater than the first voltage level; a second node (e.g., 618) configured to receive a second voltage level greater than the third voltage level; a data line (e.g., 204) selectively connected to the first latch, the second latch, and a string of series-connected memory cells (e.g., 206); a first switch (e.g., transistor 642) selectively connected between the first node and the data line; a second switch (e.g., transistor 622) selectively connected between the second node and the data line; and a controller (e.g., 116) configured to bias the data line during a programming operation of a selected memory cell of the string of series-connected memory cells connected to a selected access line (e.g., 202) as previously described at least with reference to FIGS. 1-2C and 6.

Figure 9A:
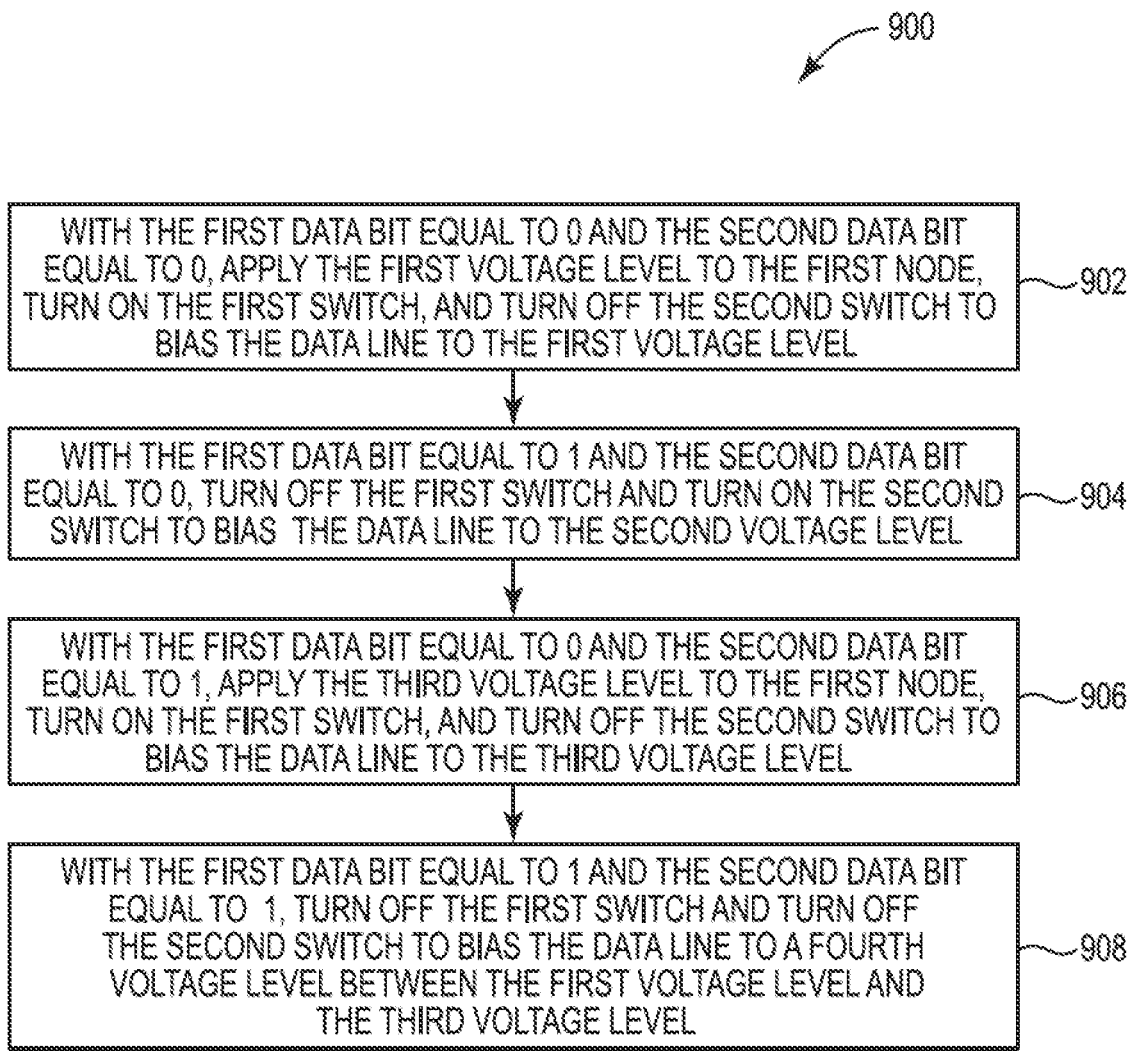

As illustrated in FIG. 9A at 902, the controller may with the first data bit equal to 0 and the second data bit equal to 0, apply the first voltage level to the first node, turn on the first switch, and turn off the second switch to bias the data line to the first voltage level. At 904, the controller may with the first data bit equal to 1 and the second data bit equal to 0, turn off the first switch and turn on the second switch to bias the data line to the second voltage level. At 906, the controller may with the first data bit equal to 0 and the second data bit equal to 1, apply the third voltage level to the first node, turn on the first switch, and turn off the second switch to bias the data line to the third voltage level. At 908, the controller may with the first data bit equal to 1 and the second data bit equal to 1, turn off the first switch and turn off the second switch to bias the data line to a fourth voltage level between the first voltage level and the third voltage level.

Figure 9B:

FIG. 9B illustrates additional details that might be implemented by the controller with the first data bit equal to 0 and the second data bit equal to 0 according to an embodiment. At 910, the controller may further with the data line biased to the first voltage level, turn off the first switch and float the data line.

Figure 9C:

The memory device in which method 900 is implemented may further include a sense amplifier latch (e.g., 686) selectively connected to the data line. FIG. 9C illustrates additional details that might be implemented by the controller with the first data bit equal to 0 and the second data bit equal to 0 according to an embodiment. At 912, the controller may further with the data line floated, connect the data line to the sense amplifier latch to maintain the data line at the first voltage level.

Figure 9D:

FIG. 9D illustrates additional details that might be implemented by the controller with the first data bit equal to 1 and the second data bit equal to 0 according to an embodiment. At 914, the controller may further with the data line biased to the second voltage level, float the data line.

The memory device in which method 900 is implemented may further include a transistor (e.g., 646) connected between the data line and the sense amplifier latch. FIG. 9E illustrates additional details that might be implemented by the controller with the first data bit equal to 1 and the second data bit equal to 1 according to an embodiment. At 916, the controller may further apply the fourth voltage level plus a threshold voltage of the transistor to a control gate of the transistor such that the data line is biased to the fourth voltage level via the sense amplifier and the transistor.

The memory device in which method 900 is implemented may further include a transistor (e.g., 610) connected between the data line and the sense amplifier latch. FIG. 9F illustrates additional details that might be implemented by the controller with the first data bit equal to 0 and the second data bit equal to 1 according to an embodiment. At 918, the controller may further prior to biasing the data line to the third voltage level, apply a fifth voltage level to a control gate of the transistor such that the data line is biased to the fourth voltage level. At 920, the controller may further apply a sixth voltage level greater than the fifth voltage level to the control gate of the transistor to bias the data line to the third voltage level.

As illustrated in FIG. 9G at 922, the controller may further with the data line biased to the first voltage level, the second voltage level, the third voltage level, or the fourth voltage level, apply a program pulse to the selected access line.

Figure 10A:
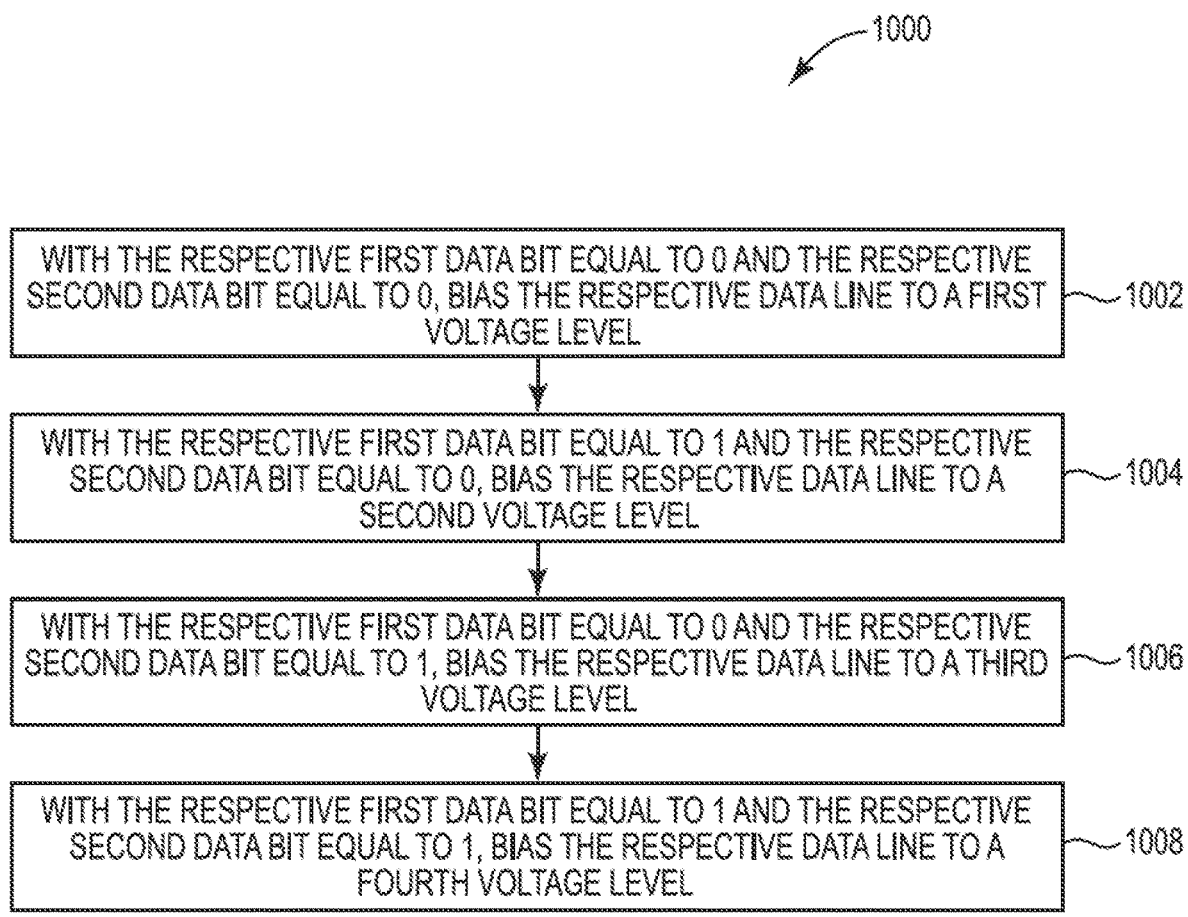
FIGS. 10A and 10B are flowcharts of a method of operating a memory in accordance with another embodiment.
Figure 10B:
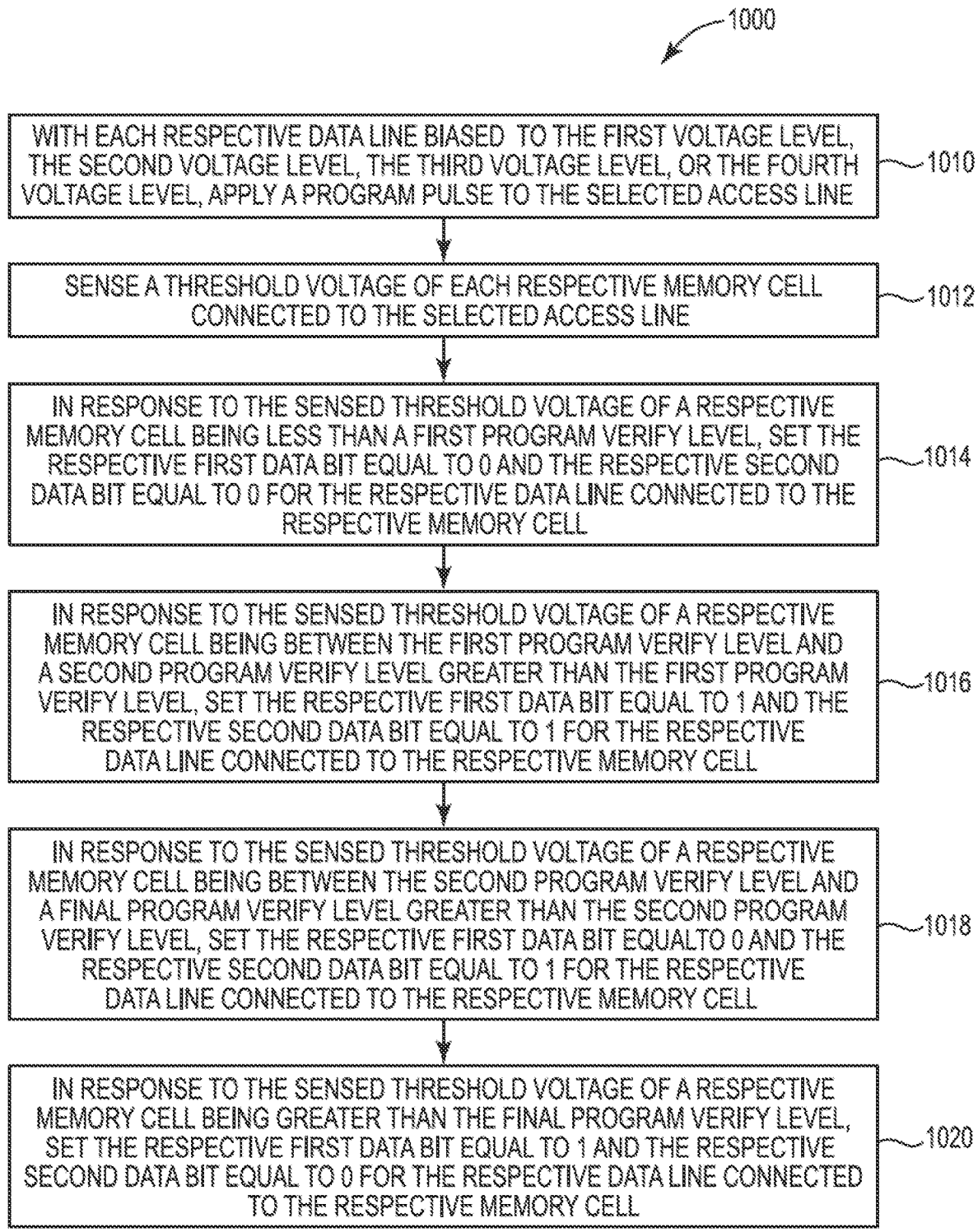

FIGS. 10A and 10B are flowcharts of a method 1000 of operating a memory in accordance with an embodiment. Method 1000 may correspond at least in part to FIGS. 6-7B. For example, FIGS. 10A and 10B might represent a method of programming one or more memory cells, e.g., a logical page of memory cells. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 1000 might be implemented within a memory device (e.g., 100) including an array of memory cells (e.g., 104) including a plurality of strings (e.g., 206) of series-connected memory cells; a plurality of data lines (e.g., 204), wherein each string of series-connected memory cells of the plurality of strings of series-connected memory cells is selectively electrically connected to a respective data line of the plurality of data lines; a plurality of access lines (e.g., 202), each access line of the plurality of access lines connected to a control gate (e.g., 236) of a respective memory cell (e.g., 208) of each string of series-connected memory cells of the plurality of strings of series-connected memory cells; a page buffer (e.g., 240) connected to the plurality of data lines. For each data line of the plurality of data lines, the page buffer might include a respective first latch (e.g., 691) to store a respective first data bit; and a respective second latch (e.g., 692) to store a respective second data bit. The memory device might also include a controller (e.g., 116) configured to bias each data line of the plurality of data lines during a programing operation of respective memory cells connected to a selected access line of the plurality of access lines. The array of memory cells might include an array of TLC memory cells, an array of QLC memory cells, or an array of PLC memory cells. The array of memory cells might include a three-dimensional NAND memory array.

As illustrated in FIG. 10A at 1002, the controller may with the respective first data bit equal to 0 and the respective second data bit equal to 0, bias the respective data line to a first voltage level. At 1004, the controller may with the respective first data bit equal to 1 and the respective second data bit equal to 0, bias the respective data line to a second voltage level. At 1006, the controller may with the respective first data bit equal to 0 and the respective second data bit equal to 1, bias the respective data line to a third voltage level. At 1008, the controller may with the respective first data bit equal to 1 and the respective second data bit equal to 1, bias the respective data line to a fourth voltage level.

The first voltage level might be less than the second voltage level, the third voltage level might be between the first voltage level and the second voltage level, and the fourth voltage level might be between the first voltage level and the third voltage level. The first voltage level might be a program voltage level, the second voltage level might be an inhibit voltage level, the third voltage level might be a slow selective slow program convergence voltage level, and the fourth voltage level might be a fast selective slow program convergence voltage level. In one embodiment, the third voltage level might be halfway between the first voltage level and the second voltage level, and the fourth voltage level might be halfway between the first voltage level and the third voltage level.

As illustrated in FIG. 10B at 1010, the controller may further with each respective data line biased to the first voltage level, the second voltage level, the third voltage level, or the fourth voltage level, apply a program pulse to the selected access line. At 1012, the controller may further sense a threshold voltage of each respective memory cell connected to the selected access line. At 1014, the controller may further in response to the sensed threshold voltage of a respective memory cell being less than a first program verify level (e.g., $PPV_2$ of FIG. 5A), set the respective first data bit equal to 0 and the respective second data bit equal to 0 for the respective data line connected to the respective memory cell. At 1016, the controller may further in response to the sensed threshold voltage of a respective memory cell being between the first program verify level and a second program verify level (e.g., $PPV_1$ of FIG. 5A) greater than the first program verify level, set the respective first data bit equal to 1 and the respective second data bit equal to 1 for the respective data line connected to the respective memory cell. At 1018, the controller may further in response to the sensed threshold voltage of a respective memory cell being between the second program verify level and a final program verify level (e.g., $PV_{TARGET}$ of FIG. 5A) greater than the second program verify level, set the respective first data bit equal to 0 and the respective second data bit equal to 1 for the respective data line connected to the respective memory cell. At 1020, the controller may further in response to the sensed threshold voltage of a respective memory cell being greater than the final program verify level, set the respective first data bit equal to 1 and the respective second data bit equal to 0 for the respective data line connected to the respective memory cell.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. A memory device comprising:
   a first latch to store a first data bit;
   a second latch to store a second data bit;
   a data line selectively connected to the first latch, the second latch, and a string of series-connected memory cells; and a controller configured to bias the data line during a programing operation of a selected memory cell of the string of series-connected memory cells connected to a selected access line, wherein the controller is further configured to:
- with the first data bit equal to 0 and the second data bit equal to 0, bias the data line to a first voltage level;
- with the first data bit equal to 1 and the second data bit equal to 0, bias the data line to a second voltage level;
- with the first data bit equal to 0 and the second data bit equal to 1, bias the data line to a third voltage level; and
- with the first data bit equal to 1 and the second data bit equal to 1, bias the data line to a fourth voltage level.

2. The memory device of claim 1, wherein the first voltage level is less than the second voltage level, the third voltage level is between the first voltage level and the second voltage level, and the fourth voltage level is between the first voltage level and the third voltage level.

3. The memory device of claim 1, wherein the first voltage level is a program voltage level, the second voltage level is an inhibit voltage level, the third voltage level is a slow selective slow program convergence voltage level, and the fourth voltage level is a fast selective slow program convergence voltage level.

4. The memory device of claim 1, wherein the third voltage level is halfway between the first voltage level and the second voltage level, and the fourth voltage level is halfway between the first voltage level and the third voltage level.

5. The memory device of claim 1, wherein the controller is further configured to with the first data bit equal to 0 and the second data bit equal to 0:
- in a first phase, bias the data line to the first voltage level;
- in a second phase following the first phase, float the data line; and
- in a third phase following the second phase, bias the data line to the first voltage level.

6. The memory device of claim 1, wherein the controller is further configured to with the first data bit equal to 1 and the second data bit equal to 0:
- in a first phase, bias the data line to the second voltage level; and
- in a second phase following the first phase, float the data line.

7. The memory device of claim 1, wherein the controller is further configured to with the first data bit equal to 0 and the second data bit equal to 1:
- in a first phase, bias the data line to the first voltage level; and
- in a second phase following the first phase, bias the data line to the third voltage level.

8. The memory device of claim 1, wherein the controller is further configured to with the first data bit equal to 0 and the second data bit equal to 1:
- in a first phase, bias the data line to the first voltage level;
- in a second phase following the first phase, bias the data line to the fourth voltage level; and
- in a third phase following the second phase, bias the data line to the third voltage level.

9. The memory device of claim 1, wherein the controller is further configured to with the first data bit equal to 1 and the second data bit equal to 1:
- in a first phase, bias the data line to the first voltage level;
- in a second phase following the first phase, float the data line; and
- in a third phase following the second phase, bias the data line to the fourth voltage level.

10. The memory device of claim 1, wherein with the data line biased to the first voltage level, the second voltage level, the third voltage level, or the fourth voltage level, the controller is further configured to apply a program pulse to the selected access line.

11. A memory device comprising:
- a first latch to store a first data bit;
- a second latch to store a second data bit;
- a first node configured to receive a selected one of a first voltage level and a third voltage level greater than the first voltage level;
- a second node configured to receive a second voltage level greater than the third voltage level;
- a data line selectively connected to the first latch, the second latch, and a string of series-connected memory cells;
- a first switch selectively connected between the first node and the data line;
- a second switch selectively connected between the second node and the data line; and
- a controller configured to bias the data line during a programing operation of a selected memory cell of the string of series-connected memory cells connected to a selected access line, wherein the controller is further configured to:
- with the first data bit equal to 0 and the second data bit equal to 0, apply the first voltage level to the first node, turn on the first switch, and turn off the second switch to bias the data line to the first voltage level;
- with the first data bit equal to 1 and the second data bit equal to 0, turn off the first switch and turn on the second switch to bias the data line to the second voltage level;
- with the first data bit equal to 0 and the second data bit equal to 1, apply the third voltage level to the first node, turn on the first switch, and turn off the second switch to bias the data line to the third voltage level; and
- with the first data bit equal to 1 and the second data bit equal to 1, turn off the first switch and turn off the second switch to bias the data line to a fourth voltage level between the first voltage level and the third voltage level.

12. The memory device of claim 11, wherein the controller is further configured to: with the first data bit equal to 0 and the second data bit equal to 0:
- with the data line biased to the first voltage level, turn off the first switch and float the data line.

13. The memory device of claim 12, further comprising:
- a sense amplifier latch selectively connected to the data line, wherein the controller is further configured to with the first data bit equal to 0 and the second data bit equal to 0:
- with the data line floated, connect the data line to the sense amplifier latch to maintain the data line at the first voltage level.

14. The memory device of claim 11, wherein the controller is further configured to with the first data bit equal to 1 and the second data bit equal to 0:
- with the data line biased to the second voltage level, float the data line.

15. The memory device of claim 11, further comprising:
- a sense amplifier latch; and a transistor connected between the data line and the sense amplifier latch, wherein the controller is further configured to with the first data bit equal to 1 and the second data bit equal to 1:
   apply the fourth voltage level plus a threshold voltage of the transistor to a control gate of the transistor such that the data line is biased to the fourth voltage level via the sense amplifier and the transistor.

16. The memory device of claim 11, further comprising:
a sense amplifier latch; and
a transistor connected between the data line and the first switch, wherein the controller is further configured to with the first data bit equal to 0 and the second data bit equal to 1:
   prior to biasing the data line to the third voltage level, apply a fifth voltage level to a control gate of the transistor such that the data line is biased to the fourth voltage level; and
   apply a sixth voltage level greater than the fifth voltage level to the control gate of the transistor to bias the data line to the third voltage level.

17. The memory device of claim 11, wherein with the data line biased to the first voltage level, the second voltage level, the third voltage level, or the fourth voltage level, the controller is further configured to apply a program pulse to the selected access line.

18. A memory device comprising:
an array of memory cells comprising a plurality of strings of series-connected memory cells;
a plurality of data lines, wherein each string of series-connected memory cells of the plurality of strings of series-connected memory cells is selectively electrically connected to a respective data line of the plurality of data lines;
a plurality of access lines, each access line of the plurality of access lines connected to a control gate of a respective memory cell of each string of series-connected memory cells of the plurality of strings of series-connected memory cells;
a page buffer connected to the plurality of data lines, wherein for each data line of the plurality of data lines the page buffer comprises:
   a respective first latch to store a respective first data bit;
   a respective second latch to store a respective second data bit; and
a controller configured to bias each data line of the plurality of data lines during a programing operation of respective memory cells connected to a selected access line of the plurality of access lines,
wherein the controller is further configured, for each data line of the plurality of data lines, to:
   with the respective first data bit equal to 0 and the respective second data bit equal to 0, bias the respective data line to a first voltage level;
   with the respective first data bit equal to 1 and the respective second data bit equal to 0, bias the respective data line to a second voltage level;
   with the respective first data bit equal to 0 and the respective second data bit equal to 1, bias the respective data line to a third voltage level; and
   with the respective first data bit equal to 1 and the respective second data bit equal to 1, bias the respective data line to a fourth voltage level.

19. The memory device of claim 18, wherein the first voltage level is less than the second voltage level, the third voltage level is between the first voltage level and the second voltage level, and the fourth voltage level is between the first voltage level and the third voltage level.

20. The memory device of claim 18, wherein the first voltage level is a program voltage level, the second voltage level is an inhibit voltage level, the third voltage level is a slow selective slow program convergence voltage level, and the fourth voltage level is a fast selective slow program convergence voltage level.

21. The memory device of claim 18, wherein the third voltage level is halfway between the first voltage level and the second voltage level, and the fourth voltage level is halfway between the first voltage level and the third voltage level.

22. The memory device of claim 18, wherein the controller is further configured to:
   with each respective data line biased to the first voltage level, the second voltage level, the third voltage level, or the fourth voltage level, apply a program pulse to the selected access line;
   sense a threshold voltage of each respective memory cell connected to the selected access line;
   in response to the sensed threshold voltage of a respective memory cell being less than a first program verify level, set the respective first data bit equal to 0 and the respective second data bit equal to 0 for the respective data line connected to the respective memory cell;
   in response to the sensed threshold voltage of a respective memory cell being between the first program verify level and a second program verify level greater than the first program verify level, set the respective first data bit equal to 1 and the respective second data bit equal to 1 for the respective data line connected to the respective memory cell;
   in response to the sensed threshold voltage of a respective memory cell being between the second program verify level and a final program verify level greater than the second program verify level, set the respective first data bit equal to 0 and the respective second data bit equal to 1 for the respective data line connected to the respective memory cell; and
   in response to the sensed threshold voltage of a respective memory cell being greater than the final program verify level, set the respective first data bit equal to 1 and the respective second data bit equal to 0 for the respective data line connected to the respective memory cell.

23. The memory device of claim 18, wherein the array of memory cells comprises an array of TLC memory cells, an array of QLC memory cells, or an array of PLC memory cells.

24. The memory device of claim 18, wherein the array of memory cells comprises a three-dimensional NAND memory array.

* * * * *

UNITED STATES PATENT AND TRADEMARK OFFICE
CERTIFICATE OF CORRECTION

PATENT NO. : 11,562,791 B1
APPLICATION NO. : 17/396825
DATED : January 24, 2023
INVENTOR(S) : Hao T. Nguyen et al.

Page 1 of 1

It is certified that error appears in the above-identified patent and that said Letters Patent is hereby corrected as shown below:

On the Title Page

(72) Inventors:
Delete "Lawrence Celso Miranda, San Jose, MN (US)" and insert in place thereof -- "Lawrence Celso Miranda, San Jose, CA (US)" --

Signed and Sealed this
Twenty-fifth Day of April, 2023

Katherine Kelly Vidal
*Director of the United States Patent and Trademark Office*